US011877390B2

(12) United States Patent
Werner et al.

(10) Patent No.: US 11,877,390 B2
(45) Date of Patent: Jan. 16, 2024

(54) FABRICATING TAMPER-RESPONDENT SENSORS WITH RANDOM THREE-DIMENSIONAL SECURITY PATTERNS

(71) Applicant: INTERNATIONAL BUSINESS MACHINES CORPORATION, Armonk, NY (US)

(72) Inventors: John S. Werner, Fishkill, NY (US); Jason T. Wertz, Pleasant Valley, NY (US); John Torok, Poughkeepsie, NY (US); Noah Singer, White Plains, NY (US); Arkadiy O. Tsfasman, Wappingers Falls, NY (US); Budy Notohardjono, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 113 days.

(21) Appl. No.: 17/460,421

(22) Filed: Aug. 30, 2021

(65) Prior Publication Data
US 2023/0068967 A1 Mar. 2, 2023

(51) Int. Cl.
*H05K 1/02* (2006.01)
*H05K 3/10* (2006.01)

(52) U.S. Cl.
CPC ............. *H05K 1/0275* (2013.01); *H05K 3/10* (2013.01); *H05K 2201/10151* (2013.01)

(58) Field of Classification Search
CPC ....... H05K 1/0275; H05K 2201/10151; H05K 2201/10371; H05K 3/10
See application file for complete search history.

(56) References Cited

U.S. PATENT DOCUMENTS 5,369,299 A * 11/1994 Byrne ................... H01L 23/573
257/769
5,468,990 A 11/1995 Daum
(Continued)

FOREIGN PATENT DOCUMENTS

| CN | 102723126 A | 10/2012 |
|---|---|---|
| CN | 102902856 A | 1/2013 |
| WO | WO 2005/022635 A1 | 3/2005 |

OTHER PUBLICATIONS

Mel et al., "The NIST Definition of Cloud Computing," National Institute of Standards and Technology, Information Technology Laboratory, Special Publication 800-145, Sep. 2011 (pp. 1-7).
(Continued)

*Primary Examiner* — Minh N Trinh
(74) *Attorney, Agent, or Firm* — Tihon Poltavets, Esq.; Kevin P. Radigan, Esq.; HESLIN ROTHENBERG FARLEY & MESITI P.C.

(57) ABSTRACT

Methods of fabricating tamper-respondent sensors with random three-dimensional security patterns are provided. The methods include establishing a security circuit pattern for a security circuit of a tamper-respondent sensor to enclose, at least in part, one or more components of a circuit board within a secure volume. The establishing includes determining in three-dimensions boundaries for the security circuit of the tamper-respondent sensor. The boundaries define a sensor volume which the security circuit is to fill in three dimensions. The establishing also includes generating at least one trace configuration for the security circuit pattern. The at least one trace configuration defines a random, three-dimensional security pattern to fill the sensor volume, and the at least one trace configuration establishes, at least in part, the security circuit pattern. The process further
(Continued)

includes fabricating the tamper-respondent sensor based on the established security circuit pattern.

16 Claims, 24 Drawing Sheets

(56) References Cited

U.S. PATENT DOCUMENTS

| | | |
|---|---|---|
| 7,758,911 B2 | 7/2010 | Heffner |
| 7,915,540 B2 | 3/2011 | Oggioni |
| 8,399,781 B1 | 3/2013 | Pham et al. |
| 8,613,111 B2 | 12/2013 | Condorelli et al. |
| 8,659,908 B2 | 2/2014 | Adams et al. |
| 9,258,877 B2 | 2/2016 | Gao et al. |
| 9,892,966 B1 | 2/2018 | Trester |
| 10,008,081 B2 | 6/2018 | Dragone et al. |
| 10,146,901 B1 | 12/2018 | Gold, Jr. et al. |
| 10,579,833 B1 | 3/2020 | Cook et al. |
| 2013/0104252 A1 | 4/2013 | Yanamadala et al. |
| 2023/0068967 A1* | 3/2023 | Werner ................ H05K 1/0275 |

OTHER PUBLICATIONS

IBM Publication, "z/Architecture Principles of Operation," IBM® Publication No. SA22-7832-12, 13th Edition, Sep. 2019 (pp. 1-2000).
James, Moses C., "Obfuscation Framework Based on Functionally Equivalent Combinatorial Logic Families", USAF, Dept. of the Air Force Air University, Air Force Institute of Technology (Year: 2008) (67 pages).

\* cited by examiner

FABRICATING TAMPER-RESPONDENT SENSORS WITH RANDOM THREE-DIMENSIONAL SECURITY PATTERNS

BACKGROUND

Many activities require secure electronic communications. To facilitate secure electronic communications, an encryption/decryption system can be implemented on an electronic assembly or circuit board assembly that is included in equipment connected to a communications network. Such an electronic assembly is an enticing target for malefactors since it may contain codes or keys to decrypt intercepted messages, or to encode fraudulent messages. To prevent this, the electronic assembly can be mounted in an enclosure, which is then wrapped in a security sensor and encapsulated with polyurethane resin. The security sensor can be, in one or more embodiments, a web or sheet of insulating material with circuit elements, such as closely-spaced, conductive lines fabricated on it. The circuit elements are disrupted if the sensor is torn, and the tear can be sensed in order to generate an alarm signal. The alarm signal can be conveyed to a monitor circuit in order to reveal an attack on the integrity of the assembly, triggering an erasure of encryption/decryption keys stored within the electronic assembly.

SUMMARY

Certain shortcomings of the prior art are overcome and additional advantages are provided through the provision, in one or more aspects, of a method which includes establishing a security circuit pattern for a security circuit of a tamper-respondent sensor to enclose, at least in part, one or more components of a circuit board within a secure volume. The establishing includes obtaining in three-dimensions boundaries for the security circuit of the tamper-respondent sensor. The boundaries define a sensor volume within which the security circuit is to reside. The establishing also includes generating at least one trace configuration for the security circuit pattern. The at least one trace configuration defines a random, three-dimensional security pattern within the sensor volume, and the at least one trace configuration establishes, at least in part, the security circuit pattern. The method also includes fabricating the tamper-respondent sensor using, at least in part, the established security circuit pattern.

In another aspect, a method is provided which includes producing a plurality of tamper-respondent sensors for a plurality of tamper-respondent assemblies. The producing includes for each tamper-respondent sensor, establishing a security circuit pattern for a security circuit of the tamper-respondent sensor to enclose, at least in part, one or more components of a respective circuit board within a secure volume. The establishing includes obtaining in three-dimensions boundaries for the security circuit of the tamper-respondent sensor. The boundaries define a sensor volume within which the security circuit is to reside. The establishing also includes generating at least one trace configuration for the security circuit pattern. The at least one trace configuration defines a random, three-dimensional security pattern within the sensor volume, and the at least one trace configuration establishes, at least in part, the security circuit pattern. The establishing further includes confirming that the security circuit pattern is distinct from any other security circuit pattern of the plurality of tamper-respondent sensors. The producing also includes fabricating the tamper-respondent sensor using, at least in part, the established security circuit pattern.

In a further aspect, a tamper-respondent assembly is provided which includes a tamper-respondent sensor to enclose, at least in part, one or more components of a circuit board within a secure volume. The tamper-respondent sensor has a security circuit within a sensor volume, and the security circuit includes at least one conductive trace in the sensor volume of the tamper-respondent sensor. The at least one conductive trace has a random, three-dimensional security pattern within the sensor volume, and the at least one conductive trace includes one or more trace segments extending at a diagonal in three-dimensions within the sensor volume. The tamper-respondent assembly further includes a monitor circuit to monitor the security circuit of the tamper-respondent sensor for a tamper event.

Additional features and advantages are realized through the techniques described herein. Other embodiments and aspects of the invention are described in detail herein and are considered a part of the claimed aspects.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting example(s) illustrated in the accompanying drawings. Descriptions of well-known materials, fabrication tools, processing techniques, etc., are omitted so as not to unnecessarily obscure the invention in detail. It should be understood, however, that the detailed description and the specific example(s), while indicating aspects of the invention, are given by way of illustration only, and are not by way of limitation. Various substitutions, modifications, additions, and/or arrangements, within the spirit and/or scope of the underlying inventive concepts will be apparent to those skilled in the art for this disclosure. Note further that reference is made below to the drawings, which are not drawn to scale for ease of understanding, wherein the same reference numbers used throughout different figures designate the same or similar components. Also, note that numerous inventive aspects and features are disclosed herein, and unless otherwise inconsistent, each disclosed aspect or feature is combinable with any other disclosed aspect or feature as desired for a particular application of a tamper-respondent sensor, or tamper-respondent assembly.

Disclosed herein are certain novel methods of fabricating tamper-respondent sensors and assemblies to, for instance, facilitate secure electronic communications using encryption/decryption systems. In one or more implementations, various tamper-respondent sensors and methods of fabrication are disclosed which provide, for instance, a security Level 4 secure volume for accommodating one or more electronic components, such as one or more encryption and/or decryption modules and associated components of, for instance, a communications card or other electronic assembly to be protected, which can provide enhanced tamper protection.

Figure 1A:
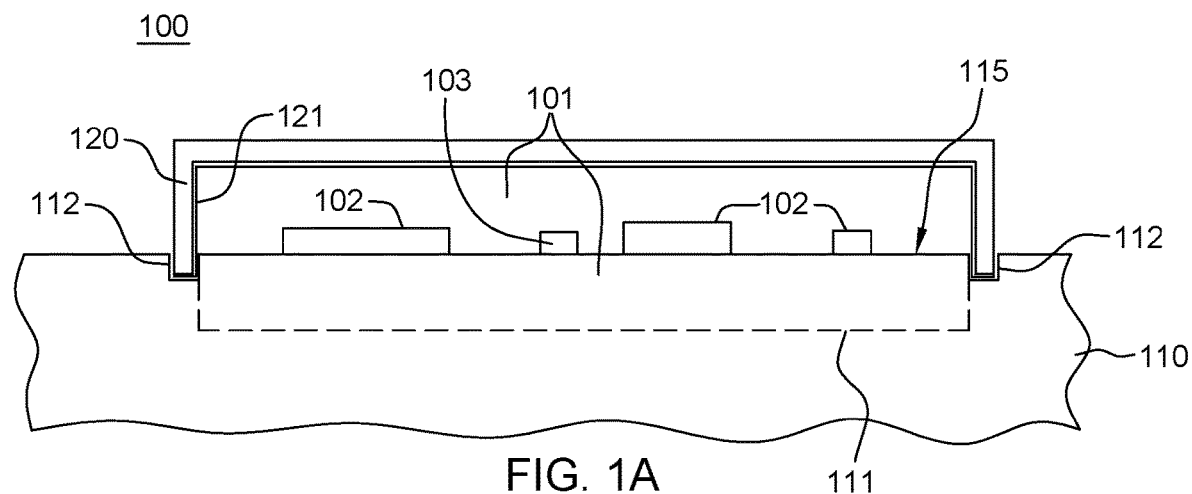
FIG. 1A is a cross-sectional elevational view of one embodiment of a tamper-proof electronic package, or tamper-respondent assembly, which can include a tamper-respondent sensor in accordance with one or more aspects of the present invention.

Referring to FIGS. 1A & 1, one embodiment of a tamper-proof electronic package or tamper-respondent assembly 100 is depicted, which includes one or more electronic components, such as a circuit 115 and/or electronic devices (or elements) 102 coupled to a multilayer circuit board 110.

Figure 1B:
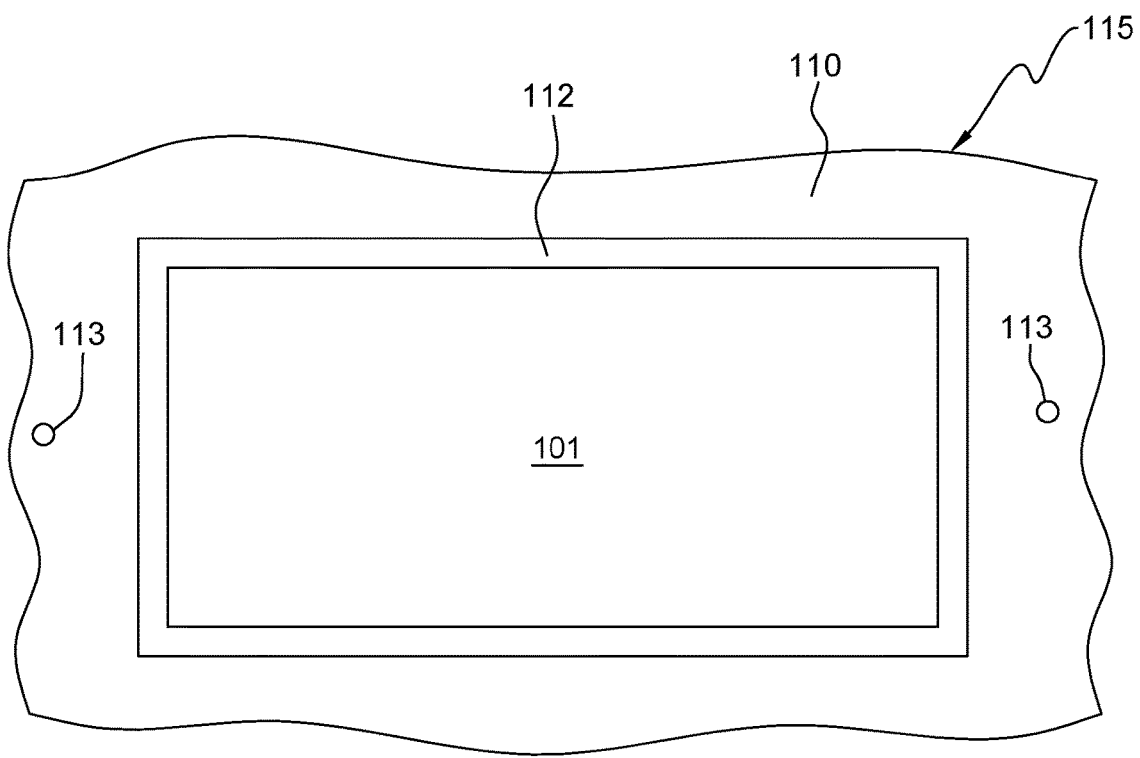
FIG. 1B is a top plan view of the multilayer circuit board of FIG. 1A.

Referring collectively to FIGS. 1A & 1B, circuit 115 resides on or is embedded within multilayer circuit board 110, which also has an embedded tamper-respondent sensor 111 that facilitates defining, in part, a secure volume 101 associated with multilayer circuit board 110 that (in one or more embodiments) extends into multilayer circuit board 110. In particular, in the embodiment of FIGS. 1A & 1B, secure volume 101 can exist partially within multilayer circuit board 110, and partially above multilayer circuit board 110. One or more electronic devices 102 are mounted to multilayer circuit board 110 within secure volume 101 and can include, for instance, one or more encryption modules and/or decryption modules, and/or associated components, to be protected within the tamper-proof electronic package. In one or more implementations, the one or more electronic components to be protected can include, for instance, components of a secure communications card of a computer system.

Tamper-proof electronic package 100 further includes an enclosure 120, such as a pedestal-type enclosure, mounted to multilayer circuit board 110 within, for instance, a continuous groove (or trench) 112 formed within an upper surface of multilayer circuit board 110, and secured to the multilayer circuit board 110 via, for instance, a structural adhesive disposed within continuous groove 112. In one or more embodiments, enclosure 120 can be made of a thermally conductive material to operate as a heat sink for facilitating cooling of the one or more electronic components 102 within the secure volume. A security mesh or tamper-respondent sensor 121 can be associated with enclosure 120, for example, wrapping around the inner surface of enclosure 120, to facilitate defining, in combination with tamper-respondent sensor 111 embedded within multilayer circuit board 110, secure volume 101. In one or more other implementations, enclosure 120 can be securely affixed to a surface of multilayer circuit board 110 (without a continuous groove) using, for instance, a bonding material such as an epoxy or other adhesive.

Briefly described, tamper-respondent sensor 121 can include, in one or more examples, one or more tamper-detection layers which include circuit lines or traces provided on one or both sides of, or within, a structural layer, which in one or more implementations, can be an insulating layer or film. The circuit lines can be of a line width and have a pitch or line-to-line spacing such that piercing of the layer at any point results in damage to one or more of the circuit lines or traces. In one or more implementations, the circuit lines can define one or more conductors which can be electrically connected in a network to a monitor circuit or detector 103, which monitors, for instance, resistance on the lines. Detection of a change in resistance caused by cutting or damaging one or more of the lines, will cause information within the secure volume to be automatically erased. The conductive lines of the tamper-respondent sensor can be in any desired pattern, such as a sinusoidal pattern or a random pattern (as described further below), to make it more difficult to breach the tamper-detection layer without detection.

For resistive monitoring, a variety of materials can be employed to form the circuit lines. For instance, the circuit lines can be formed of a metal or metal alloy, such as copper, or silver, or can be formed, for example, of an intrinsically-conductive polymer, carbon ink, or nickel phosphorous (NiP), or Omega-ply®, offered by Omega Technologies, Inc., of Culver City, California (USA), or Ticer™, offered by Ticer Technologies, Chandler, Arizona (USA). The process employed to form the fine circuit lines or traces is dependent, in part, on the choice of materials used for the circuit lines. For instance, if copper circuit lines are fabricated, then additive processing, such as plating of copper traces, or subtractive processing, such as etching away unwanted copper between trace lines, can be employed. In certain other embodiments, 3-D printing can be used to form the traces of the tamper-respondent sensor.

As noted, in one or more implementations, the circuit lines or traces of the tamper-respondent sensor(s) can line the inner surface(s) of enclosure 120, or even be printed directly onto one or more layers disposed over the inner surface of enclosure 120, and can be connected to define one or more security circuits or networks.

As depicted in FIG. 1B, one or more external circuit connection vias 113 can be provided within multilayer circuit board 110 for electrically connecting to the one or more electronic components within secure volume 101. These one or more external circuit connection vias 113 can electrically connect to one or more external signal lines or planes (not shown) embedded within multilayer circuit board 110 and extending, for instance, into a secure base region of (or below) secure volume 101. Electrical connections to and from secure volume 101 can be provided by coupling to such external signal lines or planes within the multilayer circuit board 110.

As noted, secure volume 101 can be sized to house one or more electronic components to be protected and can be constructed to extend into multilayer circuit board 110. In one or more implementations, multilayer circuit board 110 includes electrical interconnect within the secure volume 101 defined in the board, for instance, for electrically connecting one or more tamper-detection layers of the embedded tamper-respondent sensor 111 to associated monitor circuitry also disposed within secure volume 101, along with, for instance, one or more daughter cards, such as memory DIMMs, PCIe cards, processor cards, etc.

Note that the packaging embodiment depicted in FIGS. 1A & 1B is presented by way of example only. Other configurations of enclosure 120, or multilayer circuit board 110 can be employed, and/or other approaches to coupling enclosure 120 and multilayer circuit board 110 can be used. For instance, in one or more alternate implementations, enclosure 120 can be securely affixed to an upper surface of multilayer circuit board 110 (without a continuous groove) using, for instance, a structural bonding material such as an epoxy or other adhesive.

Figure 2:
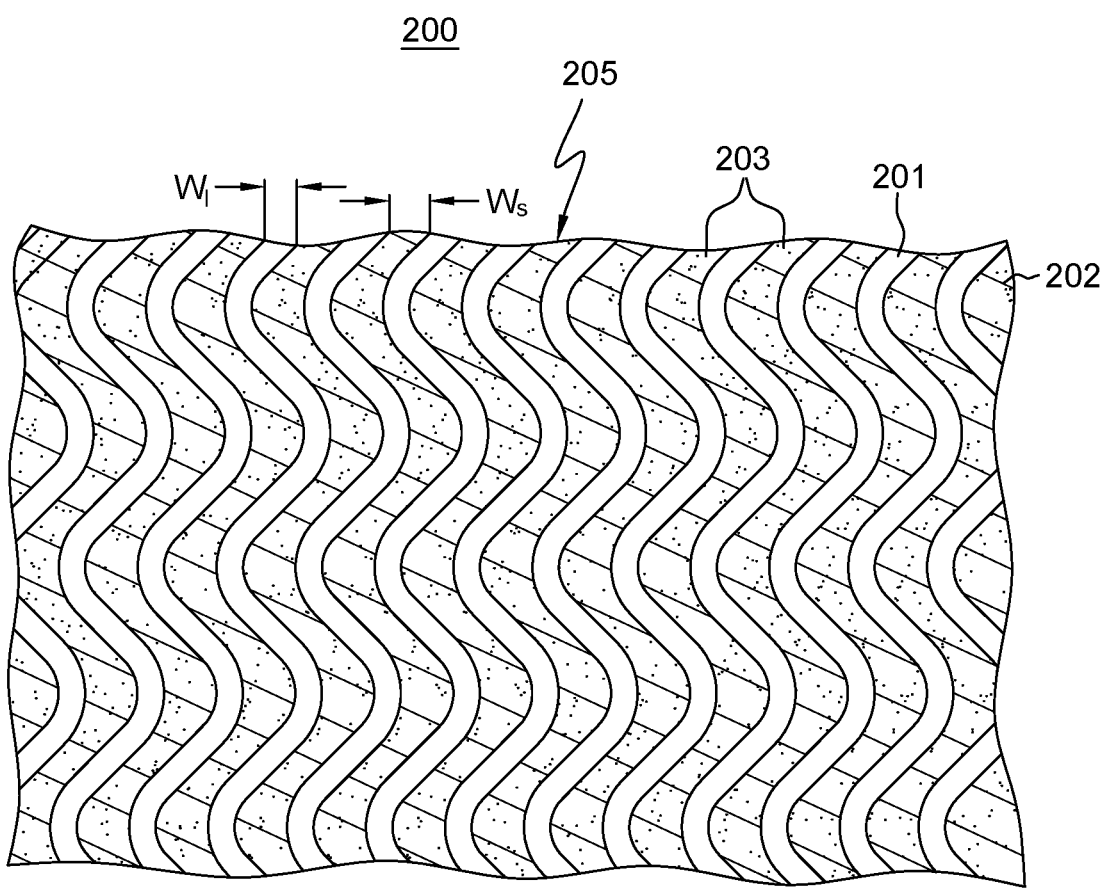
FIG. 2 depicts one embodiment of a tamper-respondent sensor with conductive lines forming, at least in part, at least one security, or tamper-detect, circuit of a tamper-respondent assembly.

By way of example, FIG. 2 depicts a portion of one embodiment of a tamper-detection layer 205 (or laser and pierce-respondent layer) of a tamper-respondent sensor 200 or security sensor. In the FIG. 2 embodiment, tamper-detection layer 205 includes tamper-detect circuit lines or traces 201 provided on one or both opposite sides of a layer, such as a flexible layer 202, which in one or more embodiments, can be a flexible insulating layer or film.

FIG. 2 illustrates circuit lines 201 on, for instance, one side of flexible layer 202, with the traces on the opposite side of the film being, for instance, the same pattern, but (in one or more embodiments) offset to lie directly below spaces 203, between circuit lines 201. As described below, the circuit lines on one side of the flexible layer can be of a line width $W_i$ and have a pitch or line-to-line spacing $W_s$ such that piercing of the layer 205 at any point results in damage to at least one of the circuit lines traces 201. In one or more implementations, the circuit lines can be electrically connected in-series or parallel to define one or more conductors which can be electrically connected in a network to a monitor circuit, which can, in one or more implementations, monitor the resistance of the lines. In one embodiment, detection of an increase, or other change, in resistance, caused by cutting or damaging one of the traces, will cause information within the encryption and/or decryption module to be erased. Providing conductive lines 201 in a pattern, such as a sinusoidal pattern, can make it more difficult to breach tamper-detection layer 205 without detection. Note, in this regard, that conductive lines 201 can be provided in any desired pattern. For instance, in an alternate implementation, conductive lines 201 can be provided as parallel, straight conductive lines, if desired, and the pattern or orientation of the pattern can vary between sides of a layer, and/or between layers. Alternatively, the conductive lines or conductive traces of the tamper-respondent sensor can be random, as described further below with reference to FIGS. 7-15.

As intrusion technology continues to evolve, anti-intrusion technology needs to continue to improve to stay ahead. In one or more implementations, the tamper-respondent sensor can cover or line an inner surface of an enclosure to provide a secure volume about at least one electronic component to be protected. Further, the tamper-respondent sensor, or more particularly, the security circuit(s) of the sensor, can be embedded within a multilayer circuit board, such as described below. Certain further enhanced sensor embodiments are also described and claimed herein.

Note that a variety of materials can advantageously be employed to form the circuit lines. For instance, the circuit lines can be formed of a conductive ink (such as a carbon-loaded conductive ink) printed onto or into one or more of the layers in a stack of layers of the sensor. Alternatively, a metal or metal alloy can be used to form the circuit lines, such as copper, silver, intrinsically conductive polymers, carbon ink, or nickel-phosphorus (NiP), such as Omega-Ply®, offered by Omega Technologies, Inc. of Culver City, California (USA), or nickel-chrome, such as Ticer™ offered by Ticer Technologies, Chandler, Arizona (USA). Note that the process employed to form the fine circuit lines or traces on the order described herein can be dependent, in part, on the choice of material used for the circuit lines. For instance, if copper circuit lines are being fabricated, then additive processing, such as plating up copper traces, or subtractive processing, such as etching away unwanted copper between trace lines, can be employed.

Figure 3:
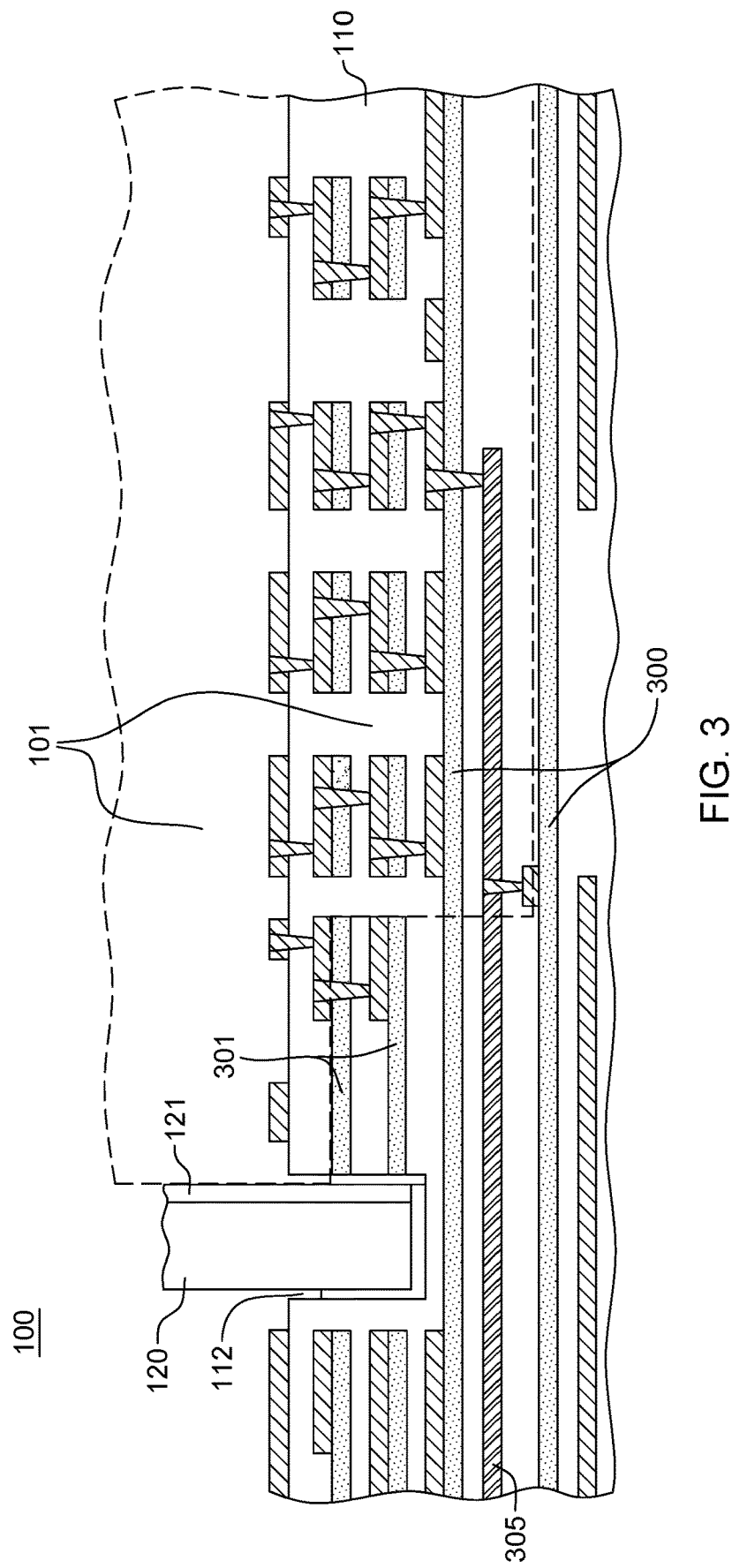
FIG. 3 is a partial cross-sectional elevational view of a more detailed embodiment of a tamper-respondent assembly, which can include a tamper-respondent sensor in accordance with one or more aspects of the present invention.

By way of further example, FIG. 3 depicts a partial cross-sectional elevational view of a more detailed embodiment of tamper-proof electronic package 100, and in particular, of multilayer circuit board 110, to which enclosure 120 is secured. In this configuration, the embedded tamper-respondent sensor includes multiple tamper-detection layers including, by way of example, at least one tamper-detection mat (or base) layer 300, and at least one tamper-detection frame 301. In the example depicted, two tamper-detection mat layers 300 and two tamper-detection frames 301 are illustrated, by way of example only. The lower-most tamper-detection mat layer 300 can be a continuous sense or detect layer extending completely below the secure volume being defined within and/or above multilayer circuit board 110. One or both tamper-detection mat layers 300 below secure volume 101 can be partitioned into multiple circuit zones, if desired. Within each tamper-detection mat layer, or more particularly, within each circuit zone of each tamper-detection mat layer, multiple circuits or conductive traces can be provided in any desired configuration. Further, the conductive traces within the tamper-detection layers can be implemented as, for instance, a resistive layer.

As illustrated, one or more external signal lines or planes 305 can enter secure volume 101 between, in one embodiment, two tamper-detection mat layers 300, and then electrically connect upwards into the secure volume 101 through one or more conductive vias, arranged in any desired location and pattern. In the configuration depicted, the one or more tamper-detection frames 301 are disposed at least inside of the area defined by continuous groove 112 accommodating the base of enclosure 120. Together with the tamper-respondent sensor(s) 121 associated with enclosure 120, tamper-detection frames 301, and tamper-detection mat layers 300, define secure volume 101, which can extend, in part, into multilayer circuit board 110. With secure volume 101 defined, in part, within multilayer circuit board 110, the external signal line(s) 305 can be securely electrically connected to, for instance, the one or more electronic components mounted to, or of, multilayer circuit board 110 within secure volume 101. In addition, secure volume 101 can accommodate electrical interconnection of the conductive traces of the multiple tamper-detection layers 300, 301, for instance, via appropriate monitor circuitry.

Added security can be provided by extending tamper-detection mat layers 300 (and if desired, tamper-detection frames 301) outward past the periphery of enclosure 120. In this manner, a line of attack can be made more difficult at the interface between enclosure 120 and multilayer circuit board 110 since the attack would need to clear, for instance, tamper-detection mat layers 300, the enclosure 120, as well as the tamper-detection frames 301 of the embedded tamper-detect circuit.

Numerous variations on multilayer circuit board 110 of FIGS. 1A-1B & 3 are possible. For instance, in one embodiment, the embedded tamper-detect circuit can include one or more tamper-detection mat layers 300 and one or more tamper-detection frames 301, such as described above, and a tri-plate structure comprising one or more external signal lines or layers sandwiched between an upper ground plane and a lower ground plane. In this configuration, high-speed transfer of signals to and from the secure volume, and in particular, to and from the one or more electronic components resident within the secure volume, can be facilitated.

Figure 4:
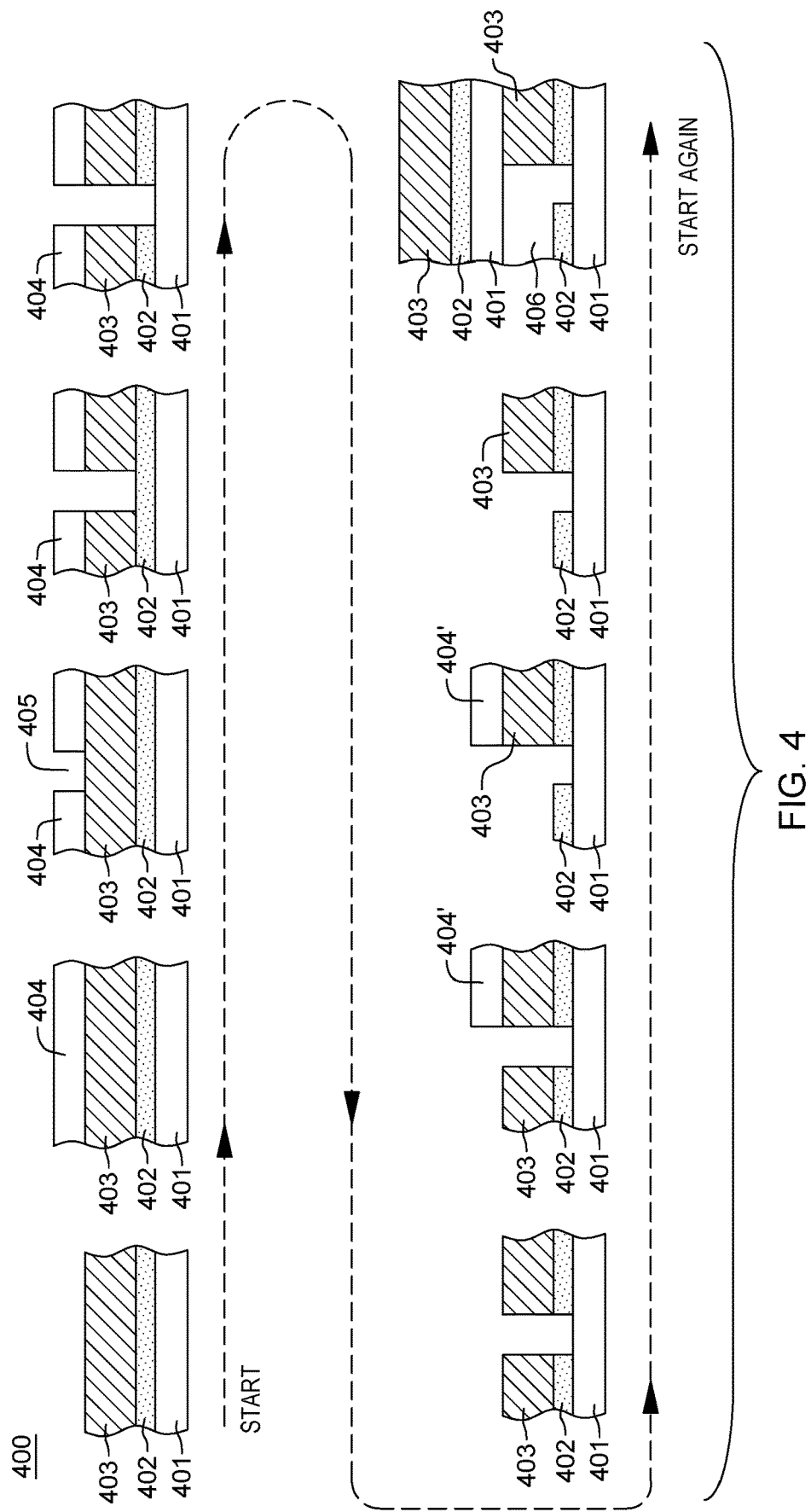
FIG. 4 depicts one embodiment of a process of fabricating a multilayer circuit board with an embedded tamper-detect circuit of a tamper-respondent assembly, in accordance with one or more aspects of the present invention.

In one or more implementations, the multilayer circuit board can be a multilayer wiring board or printed circuit board, or card, formed, for instance, by building up the multiple layers of the board. FIG. 4 illustrates one embodiment for forming and patterning a tamper-detection layer within such a multilayer circuit board.

As illustrated in FIG. 4, in one or more implementations, a tamper-detection layer, such as a tamper-detection mat layer or a tamper-detection frame disclosed herein, can be formed by providing a material stack comprising, at least in part, a structural layer 401, such as a pre-preg (or pre-impregnated) material layer, a trace material layer 402 for use in defining the desired trace patterns, and an overlying conductive material layer 403, to be patterned to define conductive contacts or vias electrically connecting to the pattern of traces being formed within the trace material layer 402, for instance, at trace terminal points. In one or more implementations, the trace material layer 402 can include nickel phosphorous (NiP), and the overlying conductive layer 403 can include copper. Note that these materials are identified by way of example only, and that other trace and/or conductive materials may be used within the build-up 400.

A first photoresist 404 is provided over build-up 400, and patterned with one or more openings 405, through which the overlying conductive layer 403 can be etched. Depending on the materials employed, and the etch processes used, a second etch process can be desired to remove portions of trace material layer 402 to define the conductive traces of the subject tamper-detection layer. First photoresist 404 can then be removed, and a second photoresist 404' is provided over the conductive layer 403 features to remain, such as the input and output contacts. Exposed portions of conductive layer 403 are then etched, and the second photoresist 404' can be removed, with any opening in the layer being filled, for instance, with an adhesive (or pre-preg) 406 and a next build-up layer is provided, as shown. Note that in this implementation, most of overlying conductive layer 403 is etched away, with only the conductive contacts or vias remaining where desired, for instance, at the terminal points of the traces formed within the layer by the patterning of the trace material layer 402. Note that any of a variety of materials can be employed to form the conductive lines or traces within a tamper-detection layer. Nickel-phosphorous (NiP) is particularly advantageous as a material since it is resistant to contact by solder, or use of a conductive adhesive to bond to it, making it harder to bridge from one circuit or trace to the next during an attempt to penetrate into the protected secure volume of the electronic circuit. Other materials which can be employed include OhmegaPly®, offered by Ohmega Technologies, Inc., of Culver City, California (USA), or Ticer™, offered by Ticer Technologies of Chandler, Arizona (USA).

The trace lines or circuits within the tamper-detection layers, and in particular, the tamper-detection circuit zones, of the embedded tamper-detect circuit, or security circuit, along with the tamper-respondent sensor monitoring the enclosure, can be electrically connected to monitor circuitry provided, for instance, within secure volume 101 (FIG. 1A) of the tamper-respondent assembly. The monitor circuitry can include various bridges or compare circuits, and conventional printed wiring board electrical interconnect inside secure volume 101 (FIG. 1A), for instance, located within the secure volume defined by the tamper-detection frames 301 (FIG. 3), and the tamper-detection mat layers 300 (FIG. 3).

Note that advantageously, different tamper-detection circuit zones on different tamper-detection layers can be electrically interconnected into, for instance, a common tamper-detect circuitry. Thus, any of a large number of interconnect configurations are possible. Note also, that the power supply or battery for the tamper-respondent sensor(s) can be located internal or external to the secure volume, with the sensor being configured in one or more embodiments to trip and destroy any protected or critical data if the power supply or battery is tampered with.

Figure 5:
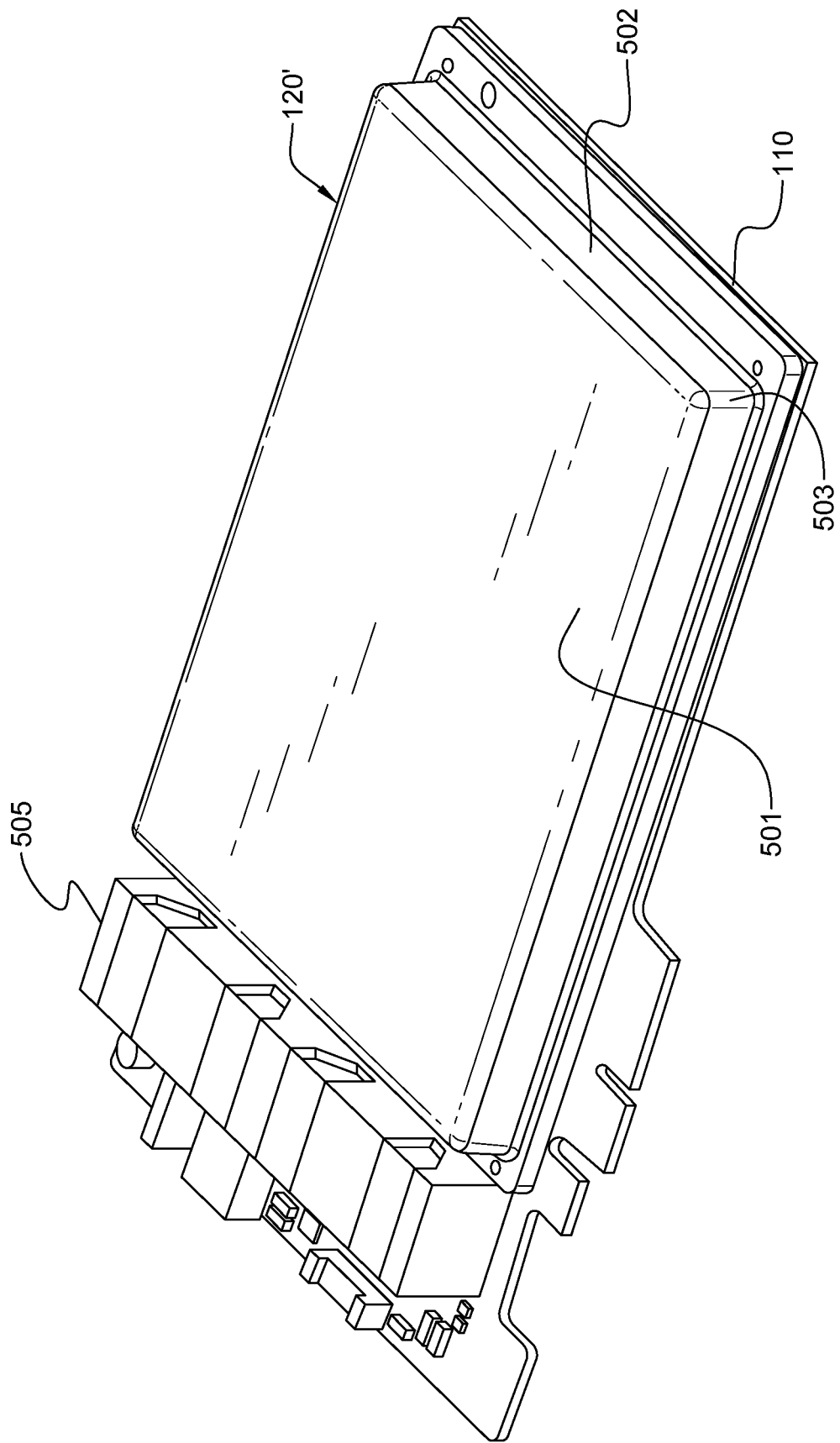
FIG. 5 is an isometric view of one embodiment of a tamper-respondent assembly, in accordance with one or more aspects of the present invention.

By way of further example, an isometric view of one embodiment of a tamper-respondent assembly is depicted in FIG. 5, where an enclosure 120' (similar to enclosure 120 of FIG. 1A) is shown sealed to multilayer circuit board 110 to define a secure volume about one or more electronic components. In the embodiment depicted, enclosure 120' is formed of a thermally conductive material, and includes a main surface 501 and sidewall(s) 502 which include sidewall corners 503. An inner surface of enclosure 500 includes an inner main surface, and an inner sidewall surface corresponding to main surface 501 and sidewall(s) 502 respectively, with the inner main surface and inner sidewall surfaces being covered, in one embodiment, by one or more tamper-respondent sensors, that is, in an embodiment such as described above. A power supply 505 or battery for the tamper-respondent sensor can be located, as depicted in this embodiment, external to the secure volume, with the tamper detector being configured to destroy any protected or critical data if the power supply or battery is tampered with. Enclosure 120' can be adhered to multilayer circuit board 110, which as noted herein, can include its own tamper protection in a variety of configurations.

When considering tamper-proof packaging, the electronic package needs to achieve defined tamper-proof requirements, such as those set forth in the National Institutes of Standards and Technology (NIST) Publication FIPS 140-2, which is a U.S. Government Computer Security Standard, used to accredit cryptographic modules. The NIST FIPS 140-2 defines four levels of security, named Level 1 to Level 4, with Security Level 1 providing the lowest level of security, and Security Level 4 providing the highest level of security. At Security Level 4, physical security mechanisms are provided to establish a complete envelope of protection around the cryptographic module, with the intent of detecting and responding to any unauthorized attempt at physical access. Penetration of the cryptographic module enclosure from any direction has a very high probability of being detected, resulting in the immediate zeroization of all plain text critical security parameters (CSPs).

A potential issue with a flexible security mesh lining an inner surface of an enclosure is that it might be susceptible to tampering, particularly at the corners and edges due to bending and stretching of the security mesh, which could potentially compromise the security circuit. Stretching of a tamper-respondent sensor with flexible layers can also reduce the width of the conductive traces, which can leave a larger area for a malefactor in which to attempt access into the secure volume without triggering the monitor circuit. Additional conductive traces can be added to existing flexible security meshes, but additional traces can lead to a lower change in resistance when a tamper event occurs, making the attempted intrusion more difficult to detect. Another issue with existing mesh security circuits for, for instance, cryptographic card assemblies, is that they are typically identical, and so it might be possible to learn the circuit pattern by sacrificing and carefully milling down the security mesh of one sensor to obtain the circuit pattern, and thereby facilitate gaining access to the encryption/decryption keys stored within the secure volume of another tamper-respondent assembly, without triggering erasure of the secure information.

Disclosed herein, in one or more aspects, are enhanced methods of fabricating tamper-respondent sensors for tamper-respondent assemblies, such as discussed herein.

As disclosed herein, in one or more embodiments, the method includes establishing a security circuit pattern for a security circuit of a tamper-respondent sensor to enclose, at least in part, one or more components of a circuit board within a secure volume. The establishing includes obtaining in three-dimensions boundaries for the security circuit of the tamper-respondent sensor. The boundaries define a sensor volume within which the security circuit is to reside. The establishing also includes generating at least one trace configuration for the security circuit pattern. The at least one trace configuration defines a random, three-dimensional security pattern within the sensor volume, and the at least one trace configuration establishes, at least in part, the security circuit pattern. The process further includes fabricating the tamper-respondent sensor using, at least in part, the established security circuit pattern.

In one or more embodiments, the establishing includes dividing the sensor volume into multiple sub-volumes, and the generating includes generating multiple trace configurations for the multiple sub-volumes. A trace configuration of the multiple trace configurations is to reside within an associated sub-volume of the multiple sub-volumes, and the trace configuration defines a respective random, three-dimensional security pattern within the associated sub-volume. In one embodiment, each trace configuration of the multiple trace configurations is a unique trace configuration.

In one or more implementations, each trace configuration of the multiple trace configurations has a respective defined start connection point and end connection point at one or more boundaries of the sensor volume. In one or more implementations, the method further includes, for each trace configuration of the multiple trace configurations, selecting a random start point and a random end point within the associated sub-volume, and providing a respective trace segment into the associated sub-volume from the start connection point to the selected random start point within the sub-volume, and another trace segment into the associated sub-volume from the defined end connection point to the selected random end point, where the trace segment and the other trace segment are segments of the respective random, three-dimensional security pattern within the associated sub-volume.

In one or more embodiments, the generating further includes comparing each generated trace configuration of the multiple trace configurations to previously accepted trace configurations to confirm that each trace configuration of the multiple trace configurations is unique.

In one or more implementations, generating the multiple trace configurations for the multiple sub-volumes further includes determining, for a trace configuration of the multiple trace configurations, whether the trace configuration meets predefined security requirements for the tamper-respondent sensor. Based on the predefined security requirements not being met, the method includes identifying in the associated sub-volume one or more sub-spaces of the sub-volume to include one or more further trace segments of the configuration trace, and generating the further trace segment(s) within the sub-space(s) to facilitate the respective random, three-dimensional security pattern within the associated sub-volume meeting the prespecified security requirements.

In one or more embodiments, the method further includes determining that each trace configuration of the multiple trace configurations meets prespecified security requirements for the tamper-respondent sensor. The determining includes creating a tamper drill simulation with a tamper drill size equal to a smallest tamper size specified for security compliance, and creating an xyz point grid over the sensor volume with an array of points. For each point of the array of points in the xyz grid, the method includes iterating through multiple drill insertion angles to check for intersection of the tamper drill with at least one trace portion of the random, three-dimensional security pattern.

In one or more embodiments, the establishing further includes defining a point grid throughout the sensor volume with an array of grid points, and the generating includes generating the at least one trace configuration for the security circuit pattern between randomly-selected grid points of the point grid defined throughout the sensor volume.

In one embodiment, the fabricating includes 3-D printing the tamper-respondent sensor using, at least in part, the established security circuit pattern.

The above-summarized, as well as various additional aspects of one or more embodiments of the present invention, are described further herein with reference to FIGS. 6-18.

By way of example, in one or more embodiments, a method is presented herein, where given geometrical boundaries for a tamper-respondent sensor and a circuit board, such as a cryptographic card, and one or more start and end connection points for a security circuit of the sensor, a randomized circuit pattern is generated to connect the one or more start points to the one or more end points. In this manner, an enhanced tamper-respondent sensor is provided for detecting a tamper event. In addition, a method is provided for checking the generated security circuit to ensure protection against a possible tamper event, and to fix the security circuit if one or more vulnerabilities are detected. In one or more embodiments, machine learning can be utilized to train the system to make the process of generating the security circuit pattern more efficient. In one embodiment, each security circuit pattern generated is unique, which advantageously prevents a malefactor from deconstructing one tamper-respondent sensor in order to gain access through another tamper-respondent sensor. Advantageously, the generated security circuit pattern(s) is confirmed to meet prespecified security requirements, and can then be built using, for instance, 3-D printing technology, or traditional circuit board fabrication technology, to thus create security circuits for circuit boards, such as cryptographic cards, that are fully unique from each other.

Figure 6:
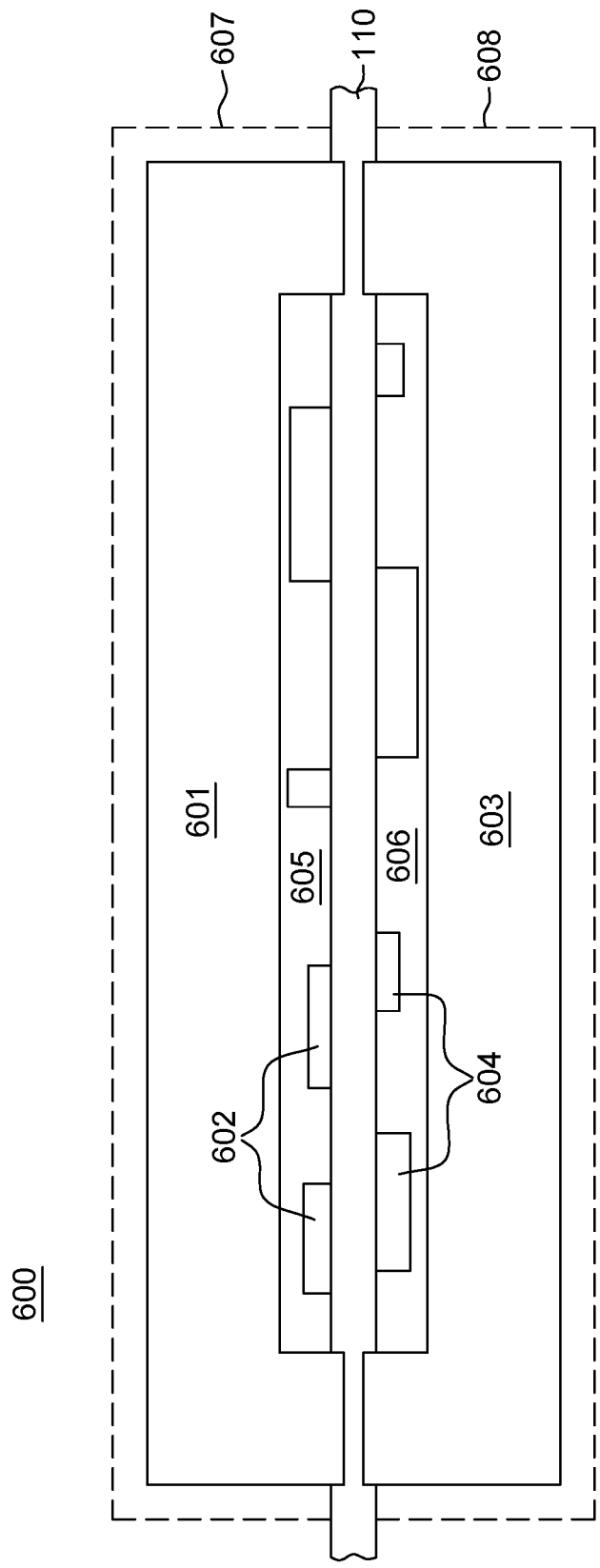
FIG. 6 is a partial cross-sectional elevational view of another embodiment of a tamper-respondent assembly with tamper-respondent sensors mounted to opposite sides of the circuit board, in accordance with one or more aspects of the present invention.

By way of example, FIG. 6 depicts a further embodiment of a tamper-respondent assembly 600 defining, for instance, a security Level 4 secure volume for accommodating one or more electronic components, such as one or more encryption and/or decryption modules and associated components of, for instance, a communications card or other electronic assembly to be protected. Tamper-respondent assembly 600 is similar to the tamper-respondent assemblies described above and includes, in one embodiment, a circuit board 110 with a tamper-respondent sensor 601 mounted to one side, and another tamper-respondent sensor 603 mounted to the opposite side of circuit board 110, such that secure volumes 605 and 606 are defined at opposite sides of circuit board 110. As described above, circuit board 110 can include, in one or more embodiments, conductive traces provided to form, at least in part, one or more tamper-detect circuits within circuit board 110 to facilitate defining secure volumes 605, 606 on the opposite sides of circuit board 110. By way of example, the tamper-detect circuits within circuit board 110 can be provided below the tamper-respondent sensor-to-circuit board interface in order to prevent access into the secure volumes through the circuit board.

Tamper-respondent sensors 601, 603 can be tamper-respondent sensors with random, three-dimensional security patterns fabricated using, for instance, 3-D printing as described herein, and in one or more embodiments, can replace the need for a separate enclosure. Alternatively, in one or more embodiments, enclosures 607, 608 can be provided over the tamper-respondent sensors 601, 603, if desired. For instance, in one embodiment, enclosures 607, 608 can be fabricated to block x-ray analysis of the respective tamper-respondent sensors 601, 603. In one or more embodiments, tamper-respondent sensors 601, 603 mount to circuit board 110 using a sensor-to-card structural adhesive at the interface between the respective tamper-respondent sensor and the circuit board.

In one or more embodiments, tamper-respondent sensors 601, 603 each include a security circuit with at least one conductive trace in a specified volume of the tamper-respondent sensor, referred to herein as the sensor volume. The at least one conductive trace has a random, three-dimensional security pattern within the sensor volume, and the at least one conductive trace includes one or more trace sections or segments extending at a diagonal in three-dimensions within the sensor volume. Further, in one or more embodiments, each security circuit has a unique security circuit pattern distinct from any other security pattern of any other tamper-respondent sensor across the same product line, or multiple product lines. As noted, the security circuits are provided for detecting an attempted tamper event into the respective secure volume 605, 606.

Figure 7:
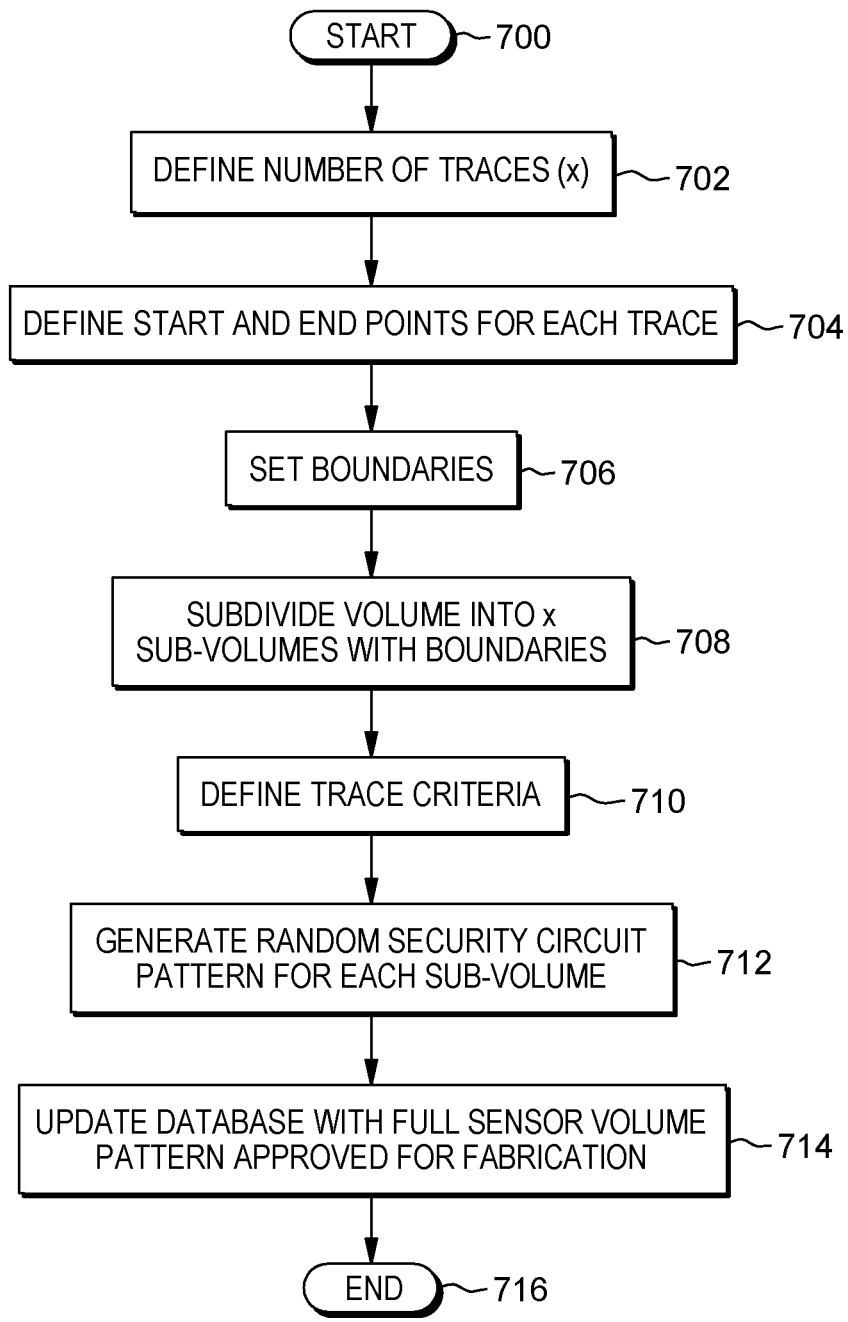
FIG. 7 depicts one embodiment of a workflow illustrating certain aspects of one or more embodiments of the present invention.

By way of example, FIG. 7 depicts one embodiment of a workflow illustrating certain aspects of one or more embodiments of the present invention. FIG. 7 depicts one embodiment of a process for establishing a random security circuit pattern. As illustrated, the process starts 700 with defining a number of traces (x) 702. In one or more implementations, the number of traces x can be defined by a user, and can correspond to the external circuitry that the random security circuit is to connect to (e.g., circuitry of the main circuit board within the secure volume of the tamper-respondent assembly). Note that a prophetic example is described herein for the generation of a random security circuit pattern which will contain six traces (with 6 being arbitrarily chosen by way of example), where it is assumed that the external circuitry has been designed with six start connection points and six end connection points (i.e., x=6).

Figure 8A:
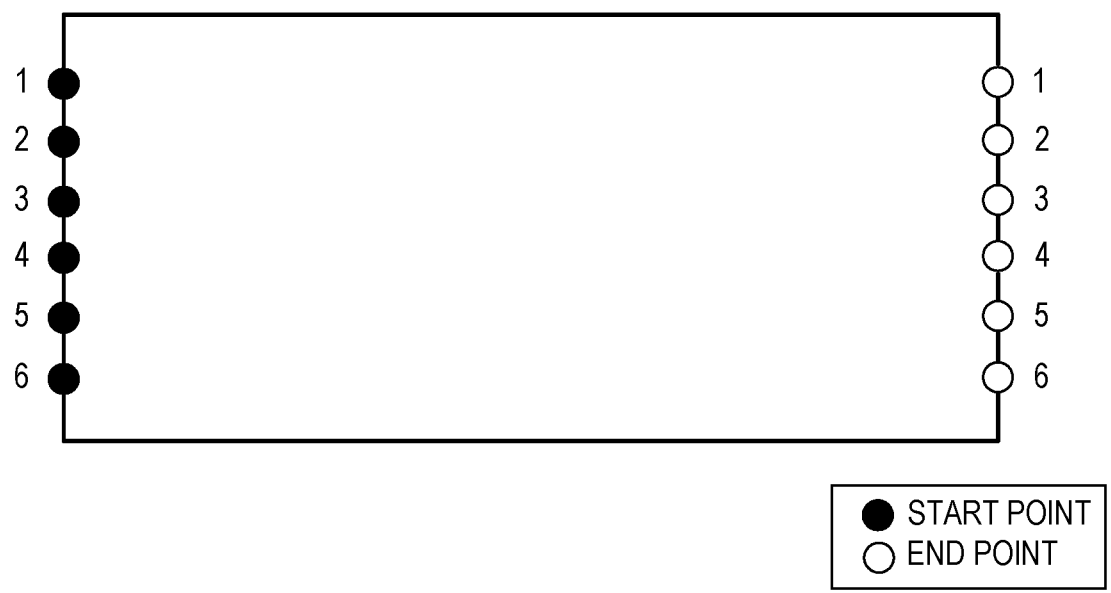
FIG. 8A depicts a plan view of a sensor volume with defined start and end connection points for multiple traces of a security circuit of a tamper-respondent sensor, in accordance with one or more aspects of the present invention.
Figure 8B:
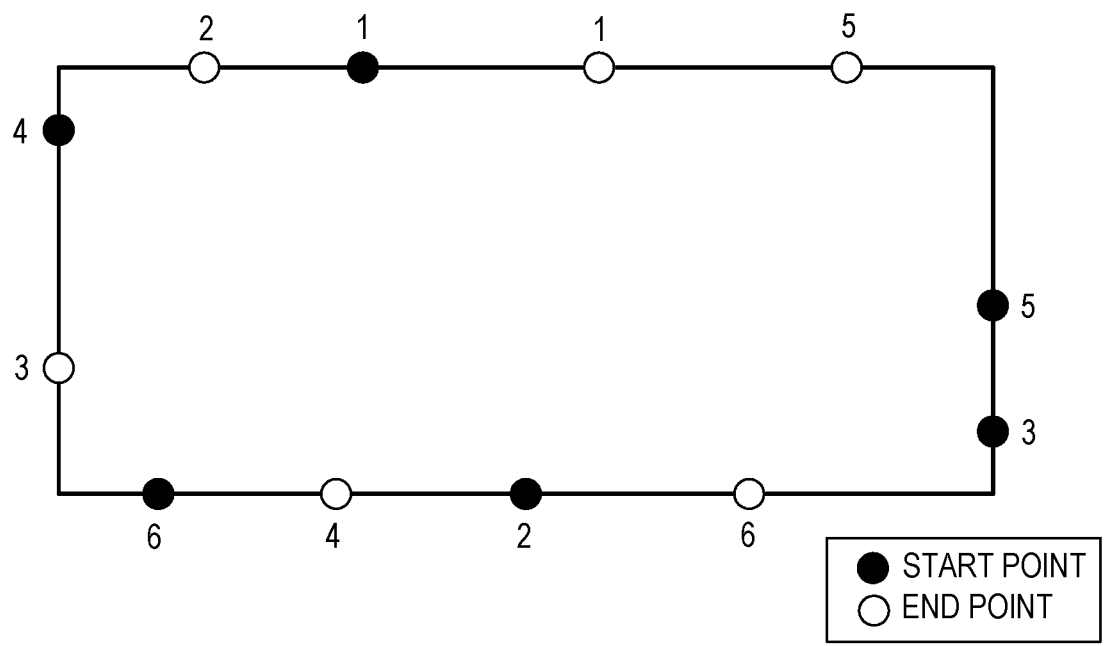
FIG. 8B depicts an alternate embodiment of a sensor volume with start and end connection points for multiple traces of a security circuit of a tamper-respondent sensor, in accordance with one or more aspects of the present invention.

The start connection points and end connection points for each trace 704 are then defined. Note that a user can specify start and end point locations based on desired connection points between the security circuit and the external circuit board. In one embodiment, the traces can all start in a concentrated position and end in another concentrated position, as illustrated in FIG. 8A, or each start connection point and end connection point location can be separate and distinct, as illustrated in FIG. 8B. Note also that the start and end points can be brought into the circuitry circuit structure on different printing or circuit layers of the sensor volume.

As illustrated in FIG. 7, boundaries are set in three-dimensions for the security circuit of the tamper-respondent sensor 706, where the boundaries indicate the edges of the circuit structure or sensor volume (e.g., length, width and height), as well as any void or keep-out areas (for instance, for mounting and/or attachment of the sensor or other components).

Figure 8C:
FIG. 8C depicts in plan view the sensor volume of FIG. 8A, divided into multiple sub-volumes for generating multiple trace configurations within the respective sub-volumes, in accordance with one or more aspects of the present invention.

In the embodiment of FIG. 7, the process includes dividing the sensor volume defined by the boundaries into multiple sub-volumes within the defined boundaries 708. The multiple sub-volumes in this example are x sub-volumes, one embodiment of which are depicted in FIG. 8C. Note that the sub-volumes can be equal in size, as shown in FIG. 8C, or boundaries for each sub-volume can be randomly selected such that one or more sub-volumes have different sizes. Note also that the entire sensor volume is to be covered by the sub-volume shapes to prevent vulnerabilities in any final randomly-generated security circuit pattern.

As illustrated, trace criteria is defined for each of the one or more traces x 710. The trace criteria can include the trace width, maximum length for a single segment of a trace, maximum total trace length, etc. The maximum total trace length can be selected such that a change in resistance due to an intrusion attempt can be readily detected. For instance, if a trace is too long, then the resistance of the path may not change significantly if nicked by a tamper tool, such as a micro drill bit, which could prevent the monitor circuit from detecting the intrusion.

Figure 8D:
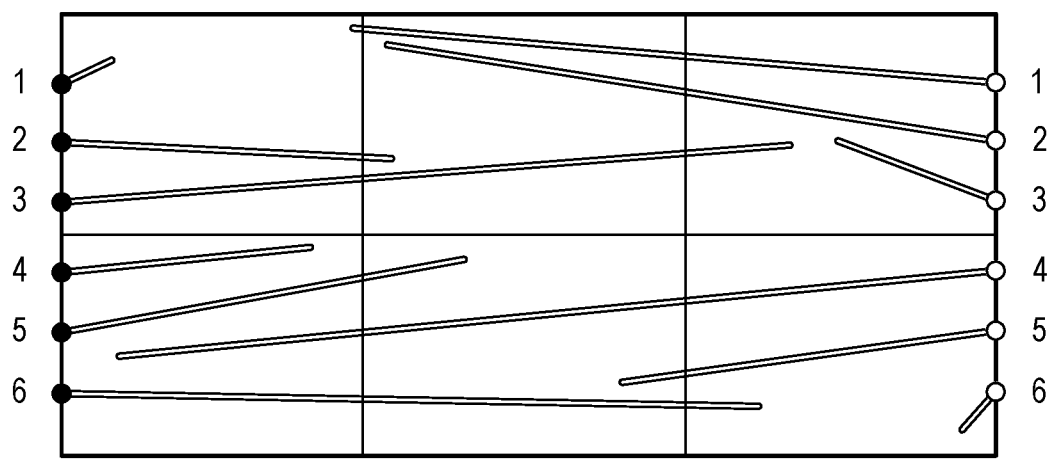
FIG. 8D depicts the sensor volume of FIG. 8C, with respective trace segments drawn to random start and end points within each associated sub-volume, which connect the respective start and end connection points into the associated sub-volume, in accordance with one or more aspects of the present invention.

In one example, shown in FIG. 8D, traces can be drawn from the corresponding start connection points and end connection points into each sub-volume before the random circuit pattern is generated into each sub-volume to prevent difficulties in connecting the generated conductive traces to one or more end points if another sub-volume security circuit pattern is blocking its path. Note that, with this approach, the start connection points and end connection points that need to be connected after the random security circuit pattern is generated are each within the same sub-volume. Each start connection and end connection point may be brought into the proper sub-volume by selecting a random point for each within the boundaries of the sub-volume. Also, note that the depiction in 8D is shown in two-dimensions, but the start connection points and end connection points can be on different layers or levels within each three-dimensional sub-volume.

A randomly-generated security circuit pattern is then established for each sub-volume 712, as illustrated in FIG. 7. One embodiment of this process is described further below with reference to FIG. 10.

Continuing with FIG. 7, the method updates a secure database with the full volume pattern approved for fabrication 714, before ending the process 716. Note that the secure database can store random security circuit patterns that have been determined to meet all security requirements, yet not have traceability back to a specific tamper-respondent assembly (e.g., a specific cryptographic card serial number). In the unlikely event that a malefactor accesses the secure database, they would have no way of knowing which security circuit pattern is on a specific tamper-respondent assembly. Note that although this disclosure references generating a pattern for three-dimensional (3-D) printing, the approved security circuit pattern can be built or constructed in a variety of approaches, and is not limited to 3-D printing only.

Figure 9:
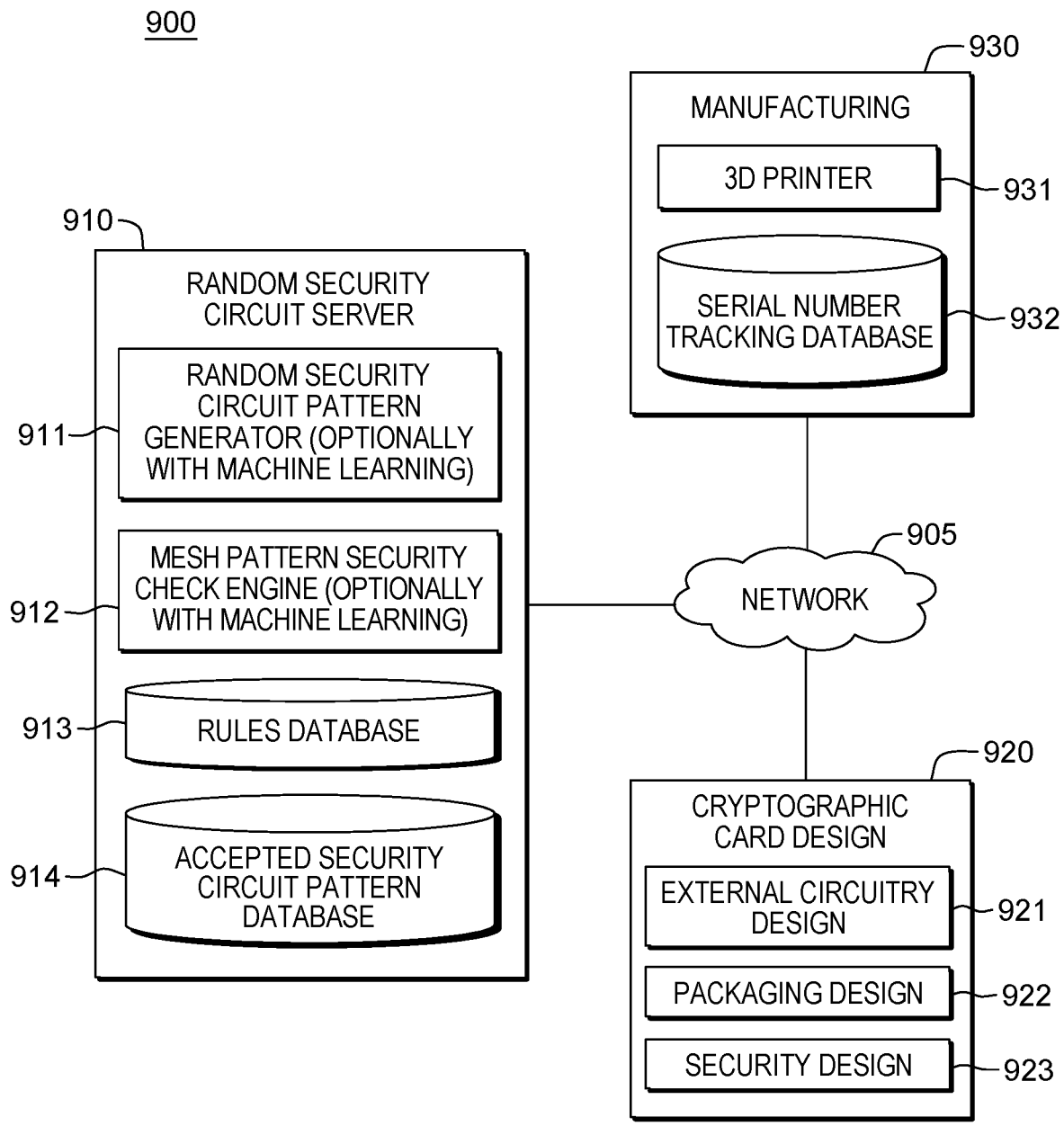
FIG. 9 depicts one embodiment of a system implementing one or more aspects of an embodiment of the present invention.

FIG. 9 depicts one embodiment of a system, generally denoted 900, for fabricating tamper-respondent assemblies, and in particular, for generating random security circuit patterns for tamper-respondent sensors of tamper-respondent assemblies, using processing such as described herein. Note in this regard that the illustrated embodiment is described herein using specific code, designs, architectures, protocols, layouts, schemes, tools, only by way of example, and not by way of limitation. Furthermore, the illustrative embodiments are described in certain instances using particular software, tools, or data processing environments only as example for clarity of description. The illustrative embodiments can be used in conjunction with other comparable or similarly-purposed structures, systems, applications, or architectures. One or more aspects of an illustrative embodiment can be implemented in software, hardware, or a combination thereof.

As illustrated, system 900 can include multiple computing environments including, for instance, a random security circuit system 910 (or server), a cryptographic card design system 920, and a manufacturing system 930, by way of example only. As illustrated, random security circuit system 910, cryptographic card design system 920, and manufacturing system 930, can communicate across one or more networks 905. By way of example, network(s) 905 can be, for instance, a telecommunications network, a local-area network (LAN), a wide-area network (WAN), such as the Internet, or a combination thereof, and can include wired, wireless, fiber-optic connections, etc. The network can include one or more wired and/or wireless networks that are capable of receiving and transmitting data, including data packets, with associated class of service profiles, such as described herein.

Figure 16:
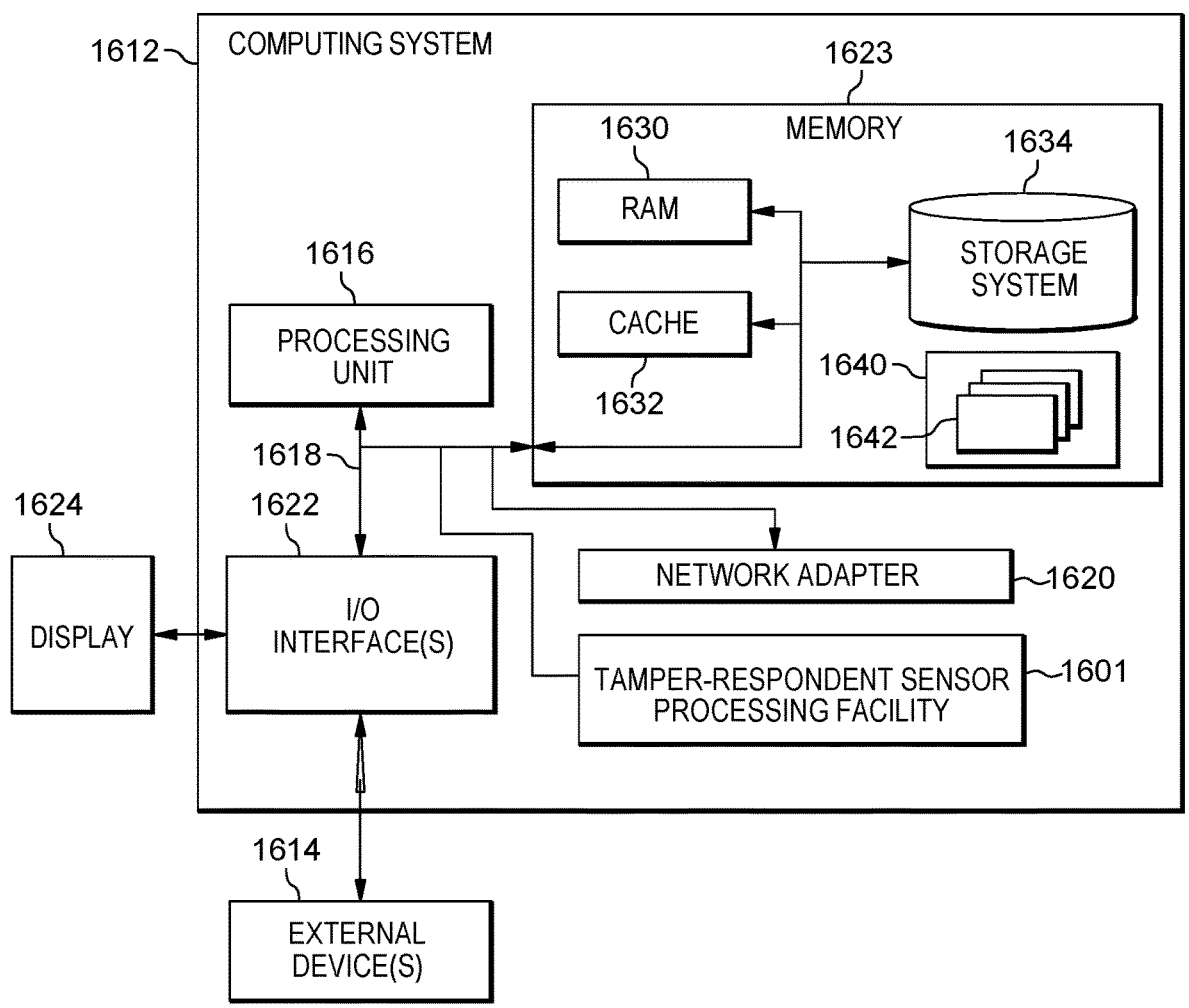
FIG. 16 depicts one embodiment of a computing node or system to implement or facilitate implementing one or more workflows, in accordance with one or more aspects of the present invention.

In one or more embodiments, one or more of the systems includes program code, as referred to in this application, which can include software and/or hardware. For example, program code in certain embodiments of the present invention can include fixed function hardware, while other embodiments can utilize a software-based implementation of the functionality described. Certain embodiments combine both types of program code. One example of program code, also referred to as one or more programs, is depicted in FIG. 16 as program/utility 1640, having a set (at least one) of program modules 1642, which can be stored in memory 1623.

In one or more embodiments, random security circuit system 910 can include certain aspects of an embodiment of the present invention. Random security circuit system 910 includes, in one embodiment, one or more computing resources that execute program code that implements a random security circuit pattern generator 911, a mesh pattern security check engine 912, a rules database 913 and an accepted security circuit pattern database 914 for use in processing, such as described herein. In one or more embodiments, one or both of random security circuit pattern generator 911 and mesh pattern security check engine 912 can implement a cognitive engine, which can include one or more machine learning agents, using one or more machine learning models.

In one or more implementations, the computing resources of random security circuit system 910 house and/or execute program code configured to perform methods in accordance with one or more aspects of the present invention. By way of example, the computing resource(s) can be a server or other computing-system-implemented resource(s). Further, for illustrative purposes only, random security circuit system 910 is illustrated as being a single computing resource. This is a non-limiting example of an implementation. In one or more other implementations, the computing resource(s), by which one or more aspects of the processing described herein (including any machine learning processing) are implemented, could, at least in part, be implemented in multiple separate computing resources or systems, such as one or more computing resources of a cloud-hosting environment, by way of example.

Briefly described, in one embodiment, the computing resource(s) of random security circuit system 910 can include one or more processors, for instance, central processing units (CPUs). Also, the processor(s) can include functional components used in the integration of program code, such as functional components to fetch program code from locations, such as cache or main memory, decode program code, and execute program code, access memory for instruction execution, and write results of the executed instructions or code. The processor(s) can also include a register(s) to be used by one or more of the functional components. In one or more embodiments, the computing resource(s) can include memory, input/output, a network interface, and storage, which can include and/or access, one or more other computing resources and/or databases, as required to implement the processing, such as a machine learning processing, described herein. The components of the respective computing resource(s) can be coupled to each other via one or more buses and/or other connections. Bus connections can be one or more of any of several types of bus structures, including a memory bus or a memory controller, a peripheral bus, an accelerated graphics port, and a processor or local bus, using any of a variety of architectures. By way of example, but not limitation, such architectures can include the Industry Standard Architecture (ISA), the Micro-Channel Architecture (MCA), the Enhanced ISA (EISA), the Video Electronic Standard Association (VESA), local bus, and Peripheral Component Interconnect (PCI). Examples of a computing resource(s) or computer system(s) which can implement one or more aspects disclosed herein are described further below with reference to FIGS. 16-18.

As noted, in one or more embodiments, random security circuit pattern generator 911 and/or mesh pattern security check engine 912, can include program code that executes, in one embodiment, a cognitive engine which includes one or more machine learning agents that facilitate training one or more machine learning models to enhance the processing described herein. As known, machine learning models can be trained using one or more training datasets that include a variety of types of data, depending on the model and the data sources. In one or more embodiments, program code executing on one or more computing resources applies machine learning algorithms of a machine learning agent to generate and train the model(s), which the program code then utilizes to perform, for instance, generating of the random security circuit pattern, and/or checking the mesh pattern for security.

By way of example only, one or more embodiments of the present invention can utilize IBM Watson® as learning agent. IBM Watson® is a Registered Trademark of International Business Machines Corporation, Armonk, New York, USA. In embodiments of the present invention, the respective program code can interface with IBM Watson Application Program Interfaces (APIs) to perform machine-learning analysis of obtained data. In some embodiments of the present invention, the respective program code can interface with the application programing interfaces (APIs) that are part of a known machine learning agent, such as the IBM Watson Application Programing Interface (API), a product of International Business Machines Corporation, to determine impacts of data on the machine learning model, and to update the model, accordingly.

As illustrated in FIG. 9, the circuit board design, such as a cryptographic card design 920, includes external circuitry design 921, packaging design 922, and security design 923, for the printed circuit. In one embodiment, external circuitry 921 would be the functional circuitry that performs the encryption, where the tamper-respondent sensor containing the random security circuit is attached to the circuit board, such as to the external circuitry, for security. Packaging design 922 includes the mechanical aspects of the design, such as the size of the circuit board (e.g., cryptographic card), component size (such as the height of any heat sink), adequate cooling, ensuring compliance standards are met, etc. The security design 923 for the printed circuit board can include additional security, such as the provision of an x-ray sensor on the cryptographic card to ensure that a tamper event could not easily scan and see the randomly-generated circuitry pattern. The external circuitry would monitor the sensor and delete security keys if x-rays are detected. Further, in one or more embodiments, lead shielding, such as a lead enclosure, can be utilized around the tamper-respondent sensor with the randomly-generated security circuit pattern, such that any tamper event could not easily scan and see the randomly-generated security circuit.

As indicated above, manufacturing system 930 can use, in one embodiment, 3-D printing 931 to fabricate, for instance, a tamper-respondent sensor such as described herein. In one embodiment, serial number tracking of the completed assembly can also be provided within an associated database 932, if desired.

Figure 10:
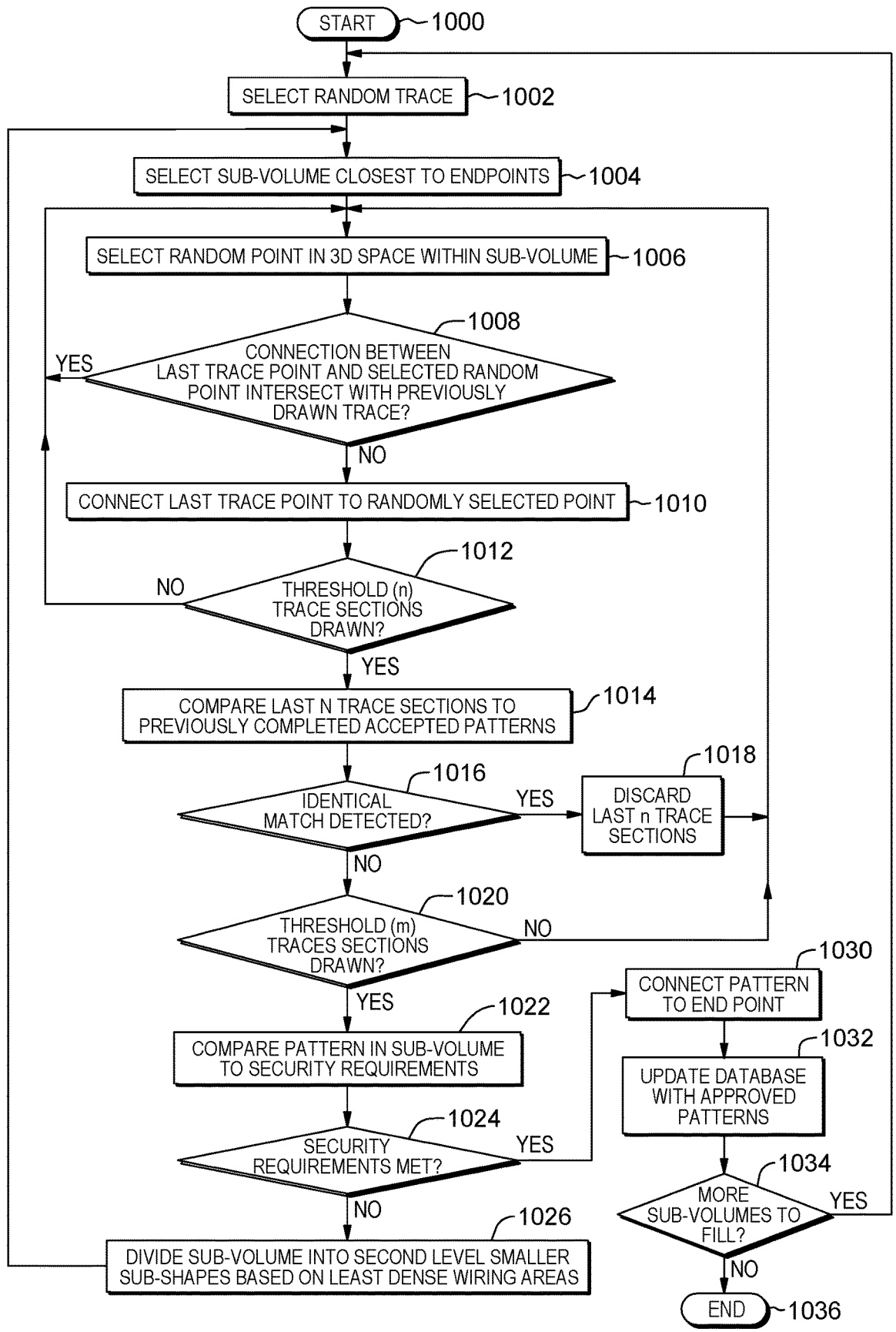
FIG. 10 depicts another embodiment of a workflow illustrating certain aspects of one or more embodiments of the present invention.

By way of example, FIG. 10 depicts another embodiment of a workflow illustrating certain aspects of one or more embodiments of the present invention. In FIG. 10, a process for generating a random security circuit pattern is illustrated which can be implemented, or used, for instance, by the random security circuit system of FIG. 9 in a process such as described above in connection with FIG. 7. The process of FIG. 10 is described below with reference to the illustrations of FIGS. 11A-11I.

Figure 11A:
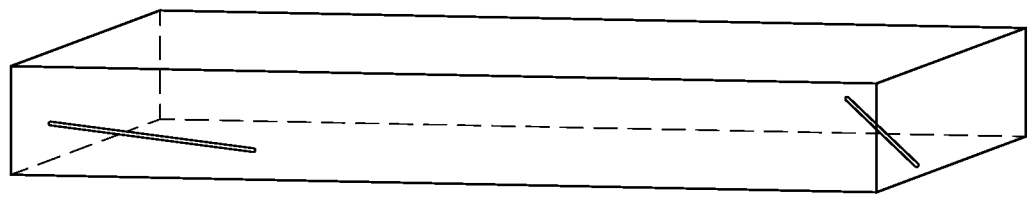
FIGS. 11A-11I illustrate generation of a trace configuration defining a security circuit pattern, in accordance with one or more aspects of the present invention.

As depicted in FIG. 10, one or more embodiments of generating a random security circuit pattern start 1000 with selecting a random trace 1002 of the one or more traces x (defined in the process of FIG. 7). Note that in this example, six traces are used by way of example only with, for instance, the last trace being selected on the first iteration. As illustrated in FIG. 10, a sub-volume is selected closest to the end point(s) (i.e., closest to the selected trace end point), that has not yet been used for another trace. This process is performed to allow for easier connection to the start and end points after one or more of the sub-volumes are filled with a respective random security circuit pattern, such that the connection has less interference with other drawn traces in other sub-volumes. Starting from the sub-volume closest to the connection end point is optional if portions of the trace have already been brought into the sub-shape from the start connection point and end connection point, as described above in the process of FIG. 7, since there is no concern of connecting a sub-volume through a dense random security circuit pattern to reach the end point, because that has already been accomplished. An embodiment of this is depicted in FIG. 11A, where trace segments have been brought into the illustrated sub-volume from the respective trace start point and trace end point, as described.

Figure 11B:
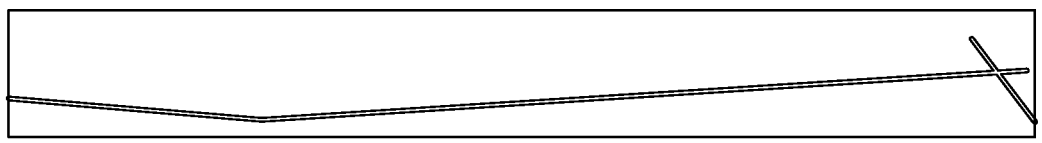

A next random point is selected within the three-dimensional boundaries of the selected sub-volume 1006, and processing determines whether a connection between the last trace point and the selected random point intersects with a previously drawn (i.e., established) trace 1008. On the first iteration, the end point of the last trace segment is the starting point, and is one of two points for the current trace that is not fully within the sub-volume, the other being the full-trace end point, where the security circuit will connect to another circuit. The starting points and the final end points of all traces can be at different heights and/or layers in the sensor volume to minimize the potential intersections at the trace start and end points. If an intersection is detected, then the process loops back to select another random point within the sub-volume. An example of an intersection is depicted in FIG. 11B, where the next random segment of the trace drawn begins from the end of the prior trace segment, and is shown to intersect, by way of example, a prior trace within the sub-volume, meaning that the new trace segment or section will be discarded, and the process repeated.

Figure 11C:
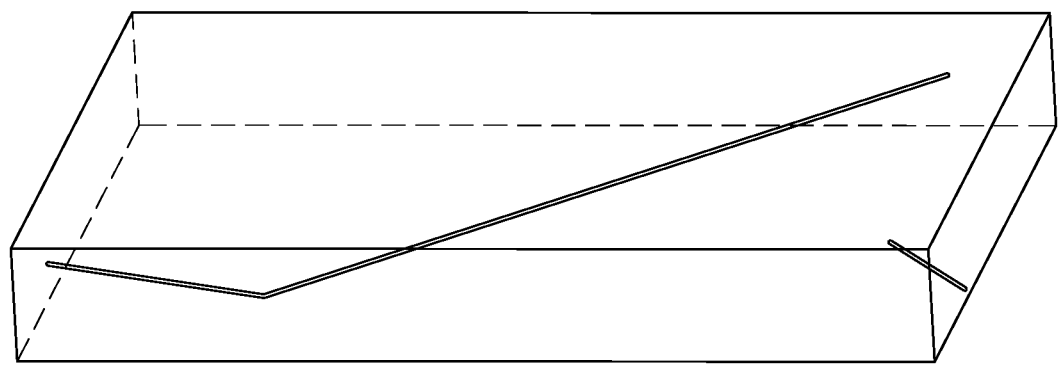

Assuming that an intersection is not detected, then the process continues with connecting the last trace point to the randomly-selected point 1010. One example of the resultant trace is illustrated in FIG. 11C, by way of example.

Figure 11D:
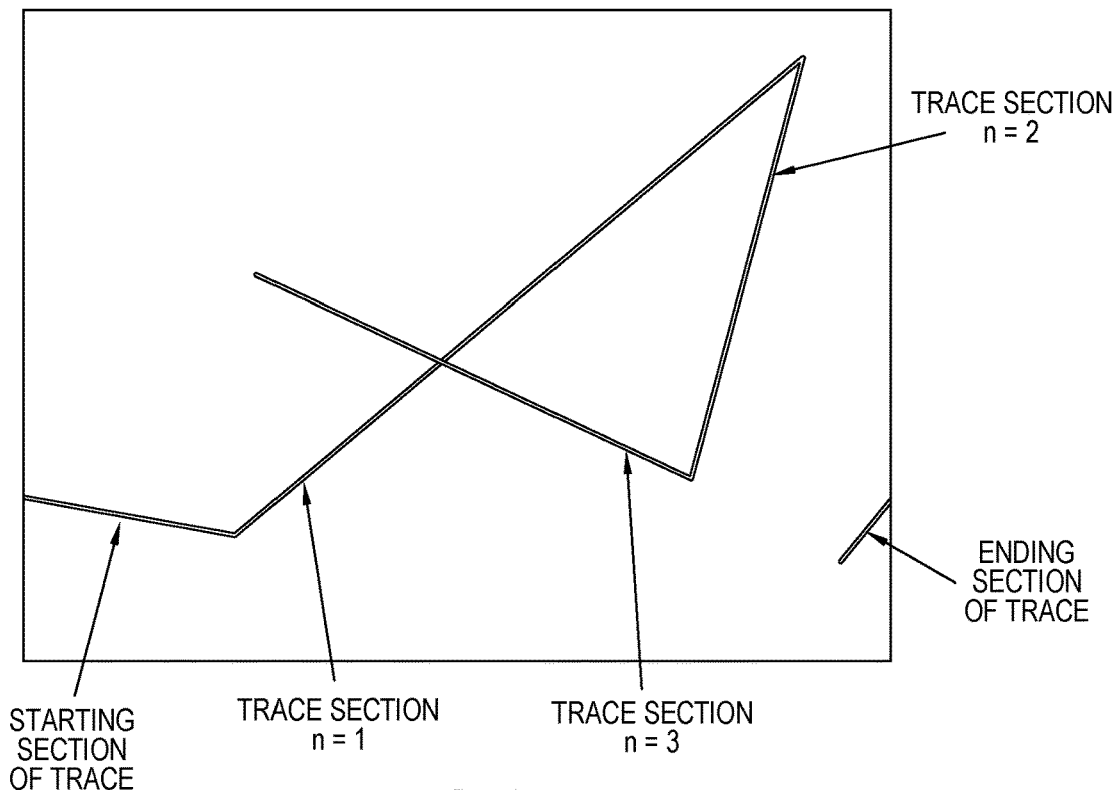

The process of FIG. 10 continues with determining whether a threshold (n) number of trace segments or sections have been established 1012 (i.e., has the loop completed at least n iterations). The threshold n can be a preselected number of trace sections that the user wishes to not have been repeated on multiple accepted patterns (e.g., the user can set n=20, such that no accepted pattern has a series of 20 identical trace sections). In the example described herein, an assumption is made that n=3 for simplicity and clarity in the images of FIGS. 11A-11I. If n sections of the trace have not yet been drawn, then the process loops back to select a next random point in the three-dimensional sub-volume to begin the process of establishing another trace segment 1006. Assuming that n sections of the trace have been established, then the last n trace segments are compared to the previously accepted trace patterns 1014, and processing determines whether an identical match is detected with a previously completed n trace pattern 1016. By way of example, FIG. 11D depicts one embodiment of a partially-complete security circuit, where n trace segments have been established, and which assumes that there have been no intersections with any of the trace segments. The trace pattern will thus be compared to all other completed security circuit patterns.

Figure 11E:
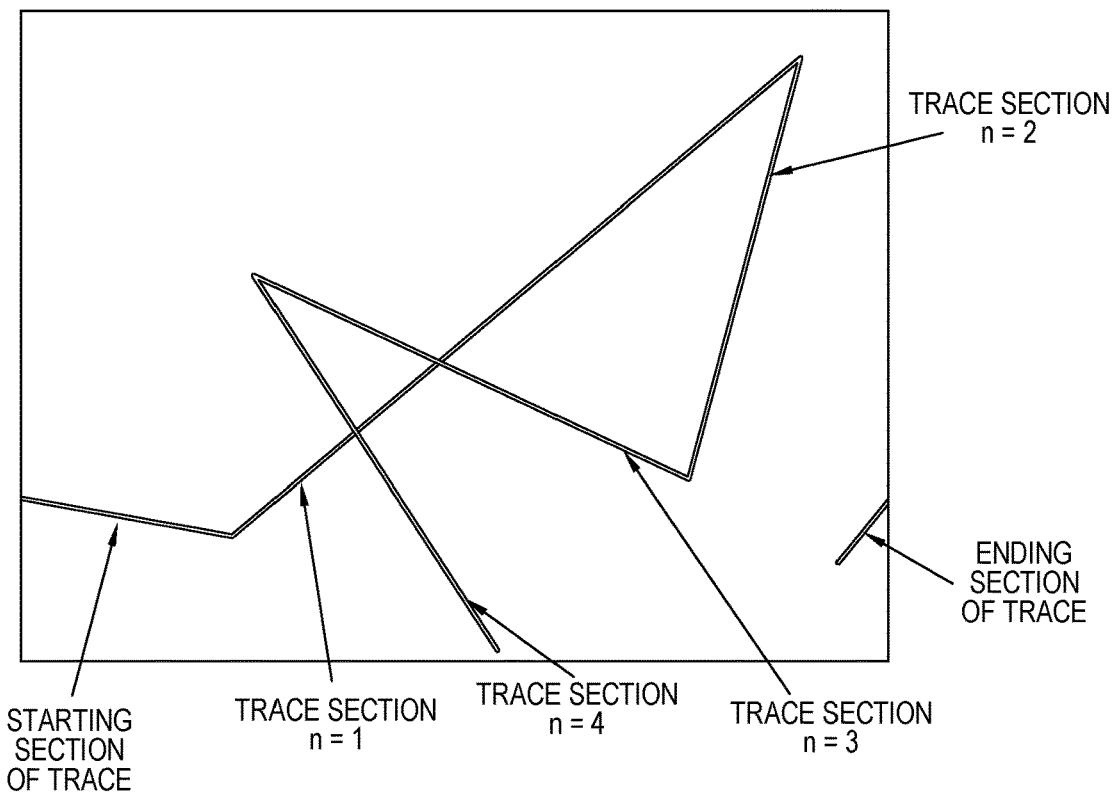

FIG. 11E illustrates an example where an additional trace segment (n=4) is established, and how the comparison process to previously completed security patterns can proceed. As before, no intersections are assumed observed with any of the trace segments. In this embodiment, traces 2-4 will be compared to all other completed security circuit patterns. If these three trace segments exist exactly in any other sub-volume or completed security circuit pattern, then they will be discarded 1018 (FIG. 10), and the process will restart from where it was n traces ago (which in this example, means that the process would go back to the end of trace segment n=1). Otherwise, processing determines whether a threshold (m) number of trace segments have been established yet 1020.

The threshold m can be a preselected number of trace segments that the user or system believes could result in covering the sub-volume to the point where cryptographic security requirements can be met. In one or more embodiments, the threshold m can be refined using cognitive learning to alter its value by using data from previously accepted patterns that have met the cryptographic security requirements. If m trace segments of the security circuit have not yet been established, then the process loops back to begin drawing the next trace segment. In the example of FIGS. 11A-11I, it is assumed that m=10 for simplicity and clarity of the images only.

Figure 11F:
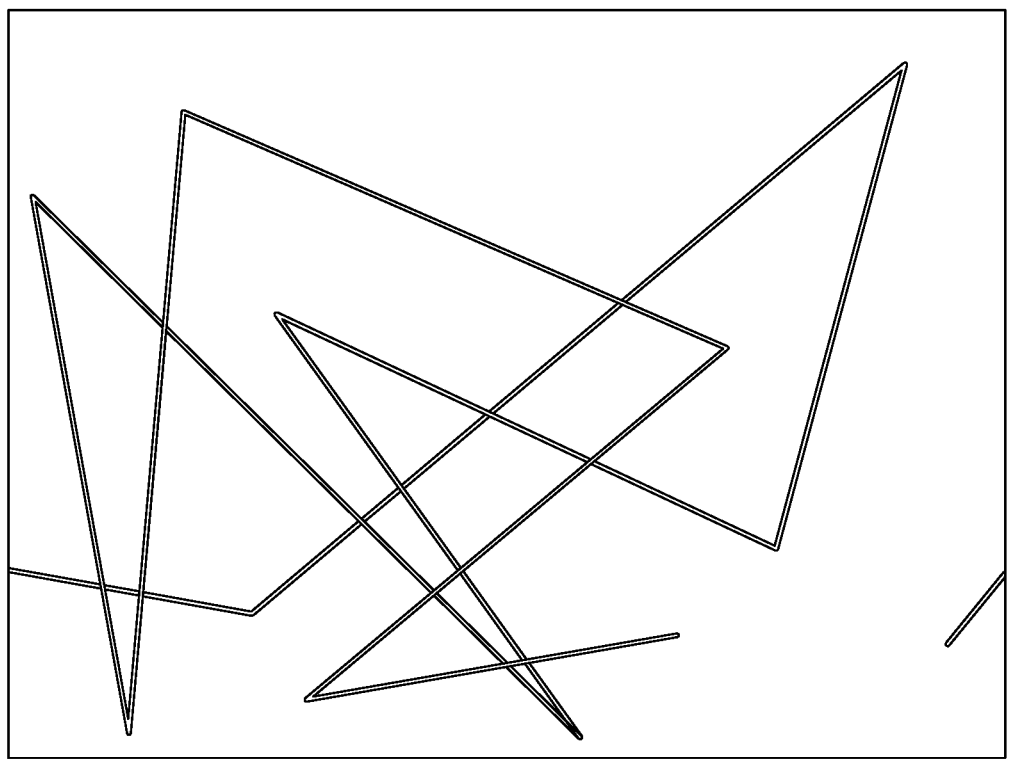

FIG. 11F is a plan view of one example of a sub-volume where m segments of a trace have been established (that is, the "YES" branch from inquiry 1020), and the method proceeds to compare the pattern in the sub-volume to prespecified security requirements 1022, such as, in one example, to prespecified cryptographic security requirements. By way of example, one embodiment for checking the established security circuit pattern against prespecified security requirements is described further below with reference to FIG. 12.

Figure 11G:
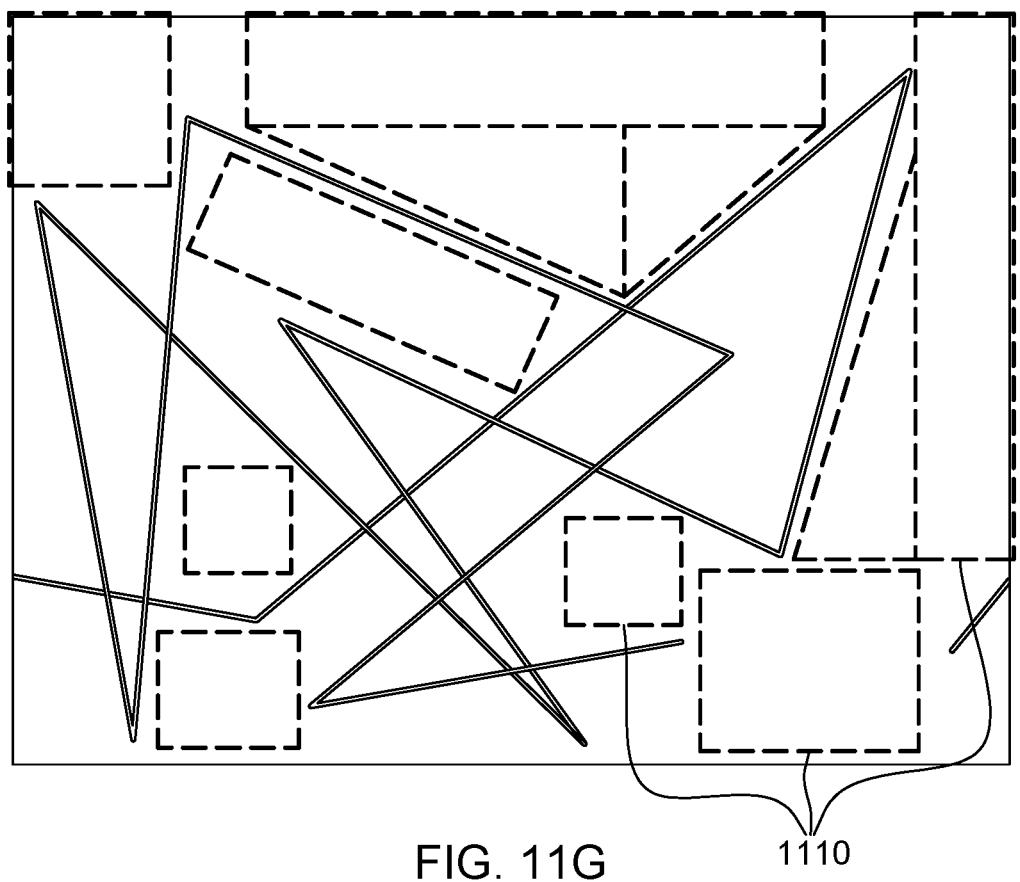
Figure 11H:
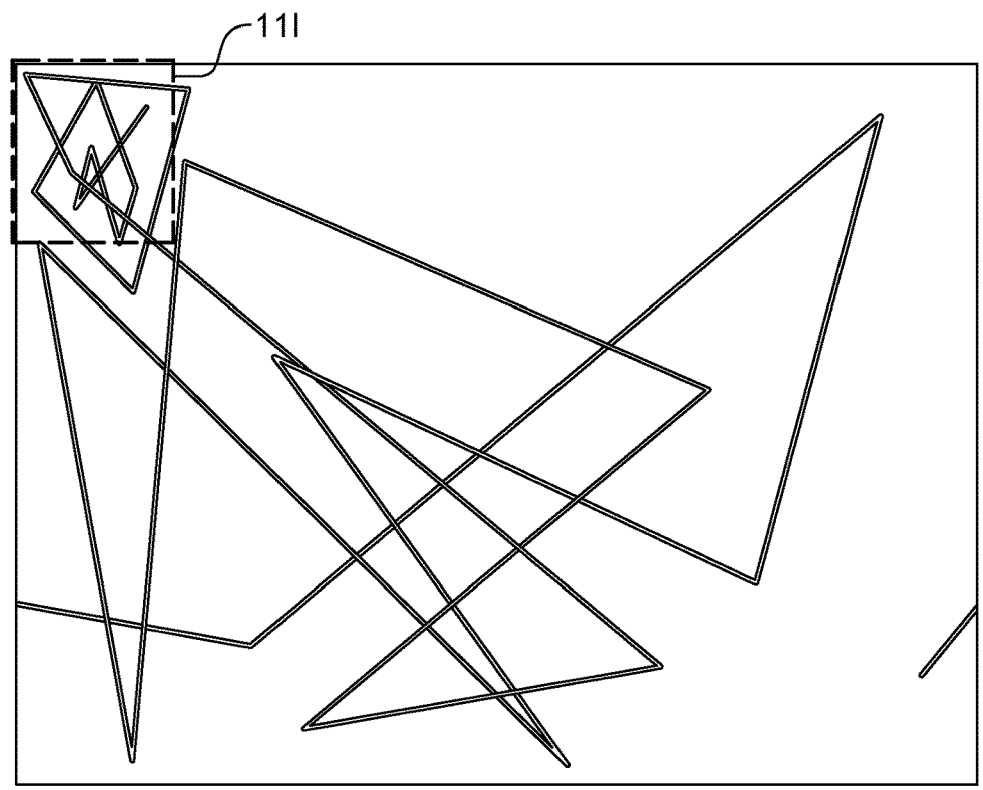
Figure 11I:
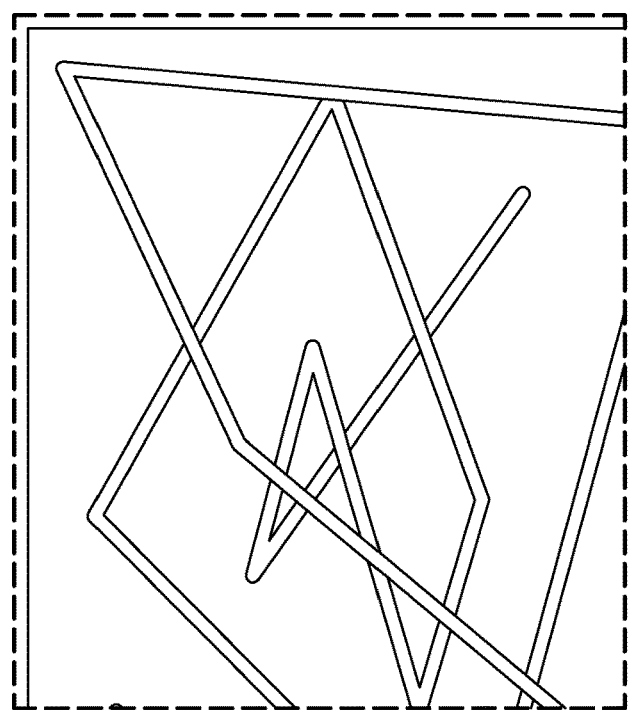

Processing next determines in FIG. 10 whether the security requirements have been met 1024, and if not, the current sub-volume is further divided into second-level, smaller sub-areas or smaller sub-volumes, based on the identified least-dense conductive trace areas that do not meet the security requirements. An example of this is depicted in FIG. 11G, where less-dense circuit areas or volumes 1110 are identified. Note that although referenced as second-level, it is possible that due to recursion in the process, the smaller, less-dense areas may be on further levels (e.g., third-level, fourth-level, fifth-level, etc.). In the example described herein, the shapes 1110 signify, by way of example, second-level areas that may be identified. Note that these areas are shown as rectangles and triangles, but can be any geometry in 3-D space. The process will use the end of trace section n=10 as a starting point when any less-dense areas are to be filled in. Any remaining open areas after the less-dense areas are filled in will be recognized in a third-level area processing, and so on, until the pattern meets the security requirements. FIGS. 11H & 11I depict one example of inserting a random security circuit pattern within one of these less-dense sub-volumes or sub-areas where, in this example, it is assumed that the top-left, second-level area of FIG. 11G is being backfilled with trace segments that now meet the security requirements.

Once the prespecified security requirements have been met, the established security circuit pattern is connected to the sub-volume end point. As noted, the end point may have already been extended into the sub-volume, or the end point may be at an edge or boundary of the full security circuit pattern. Note also that multiple trace segments may be required to transition from the last section of trace drawn to the end point, that is, if a direct path does not exist due to other trace segments being in the way.

In one or more embodiments, the database is updated with the approved sub-volume security circuit pattern 1032, and processing determines whether more sub-volumes remain to be filled 1034. If so, then processing loops back to repeat the process for the next sub-volume. If there are no more sub-volumes to fill, then processing ends 1036.

Figure 12:
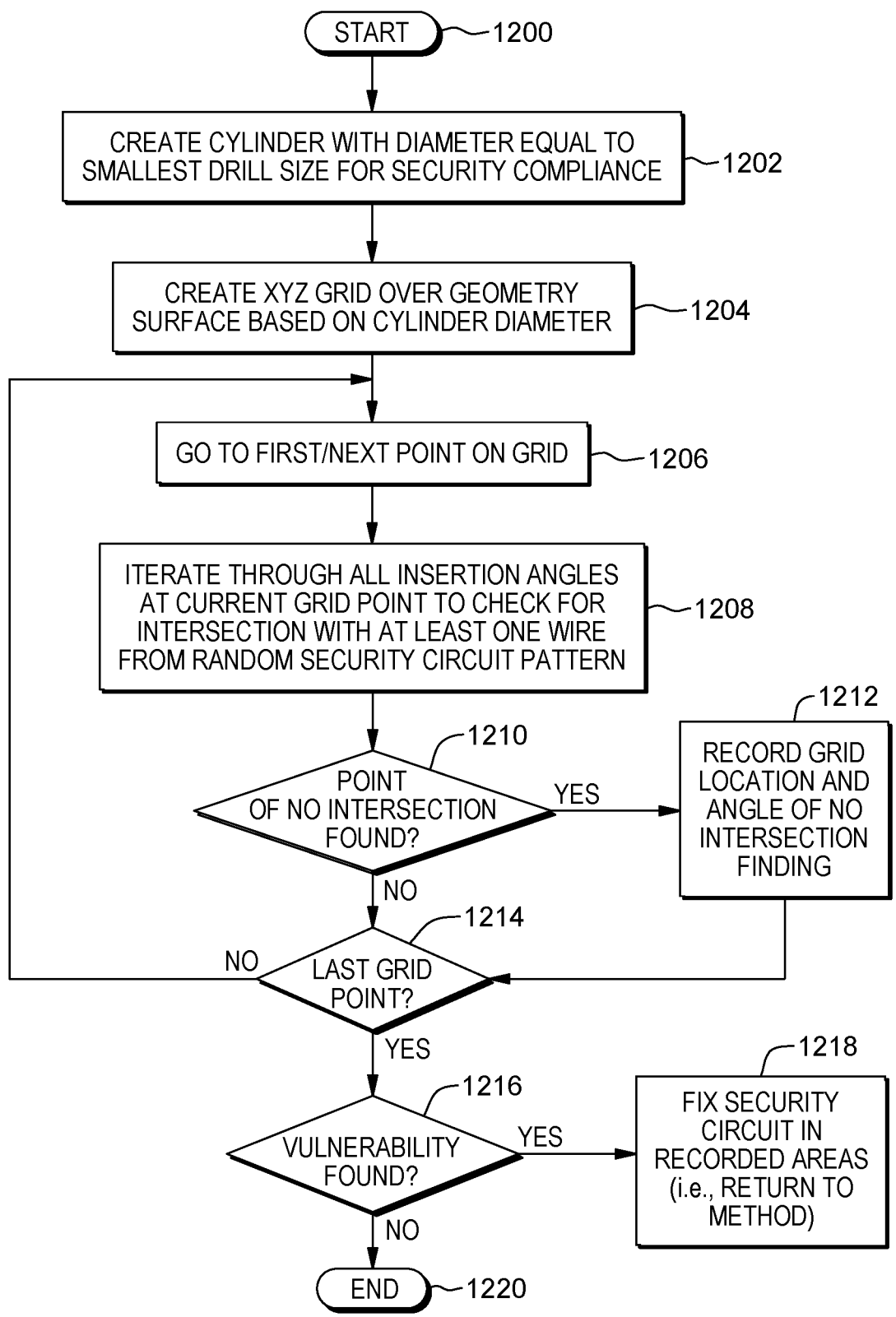
FIG. 12 depicts a further embodiment of a workflow illustrating certain aspects of one or more embodiments of the present invention.
Figure 13A:
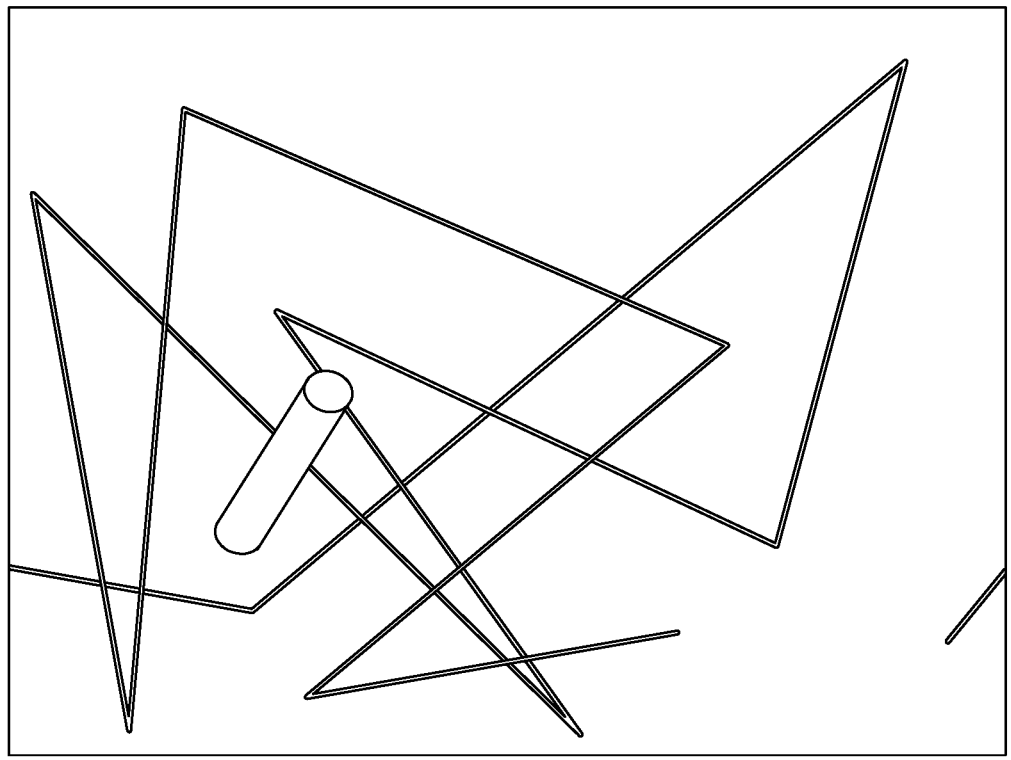
FIGS. 13A-13D illustrate exemplary checking of a security circuit pattern to ensure prespecified security requirements are met, in accordance with one or more aspects of the present invention.
Figure 13B:
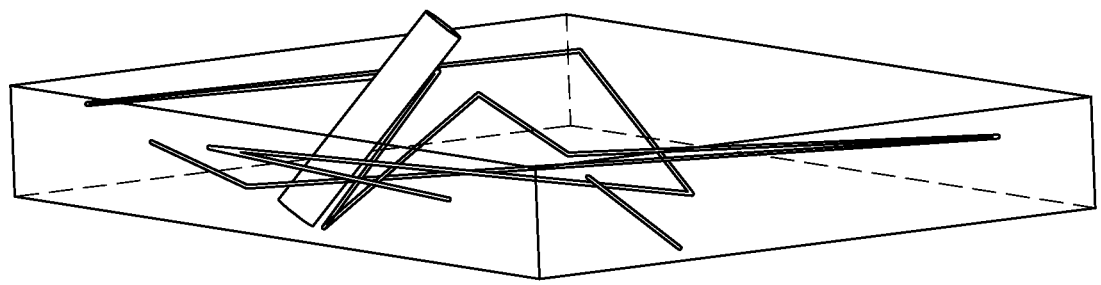
Figure 13C:
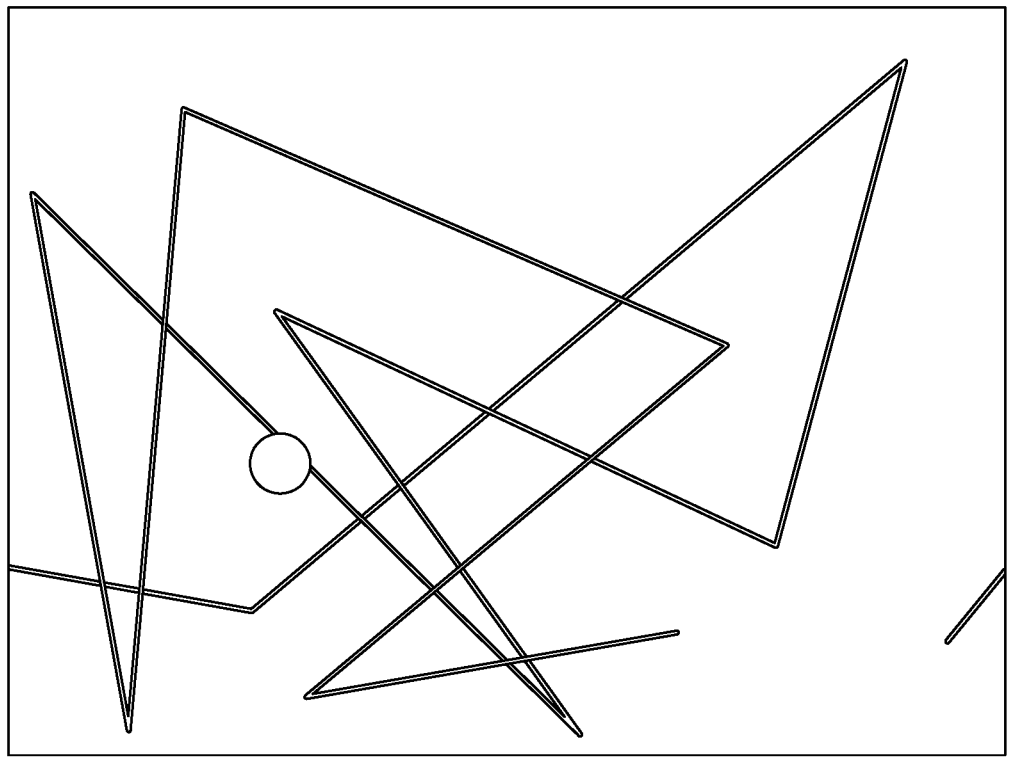
Figure 13D:
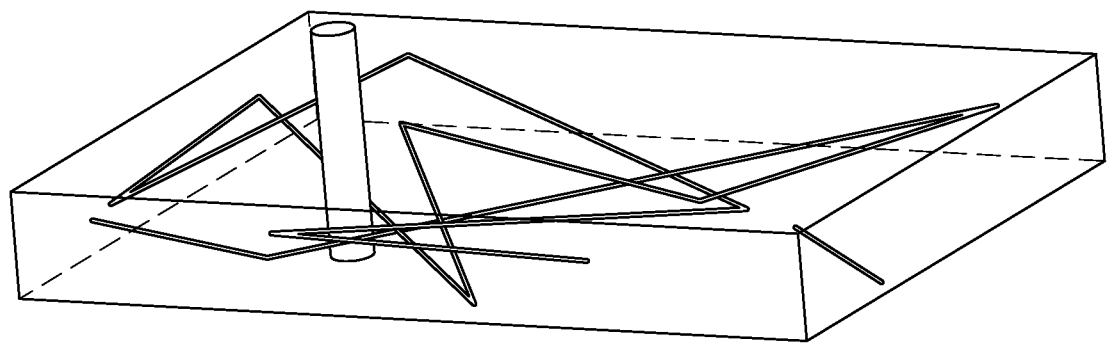

As noted, FIG. 12 depicts one embodiment of a program code implemented process for checking to determine whether an established security circuit pattern meets prespecified security requirements. This process can be used, in one or more embodiments, in conjunction with the program code processing of FIG. 10 to verify a security circuit pattern against, for instance, the defined security requirements. Referring to FIG. 12, processing starts 1200 by creating (e.g., simulating) a tamper tool, such as a tamper drill with a diameter equal to a smallest drill size for the desired security compliance level 1202. For instance, a cylinder can be simulated with a desired drill size diameter, such as, for instance, 8 mils, and with the length of the cylinder being variable or infinite. An xyz point grid is created over the sensor volume or geometry surface for probing points based on the tool diameter 1204. In one or more embodiments, a three-dimensional grid is used to account for side walls and an upper or lower surface of the volume, which may not be flat (e.g., a surface can conform to components or other mechanical constraints). The process then begins an iterative check of all points on the grid using the simulated tamper tool (e.g., cylinder) 1206. In one embodiment, processing iterates through all insertion angles at a current grid point to check for any intersection with at least one conductive trace from the random security circuit pattern 1208. An embodiment of this is depicted in FIGS. 13A-13B. Note that the angle of the simulated tamper tool to the surface can be anywhere from 0° to 90°, and can be rotated 360° about the current xy intercept. The angle can be incremented based on the cylinder's diameter. Further, the angle increments can occur dynamically, depending upon how much intersection is measured at each point to minimize processing operations. By way of example, FIGS. 13C-13D depict an exemplary intersection of the simulated tool with a conductive trace of the security circuit pattern.

Processing determines whether no point of intersection was found 1210, based on all the iterations, which if found, indicates that a tamper event could penetrate through the pattern without being detected. Assuming that no point of intersection is detected, such as is the case with FIGS. 13A & 13B (which illustrate the same insertion angle in different views), then processing determines whether the last grid point has been processed 1214. Assuming that no point of intersection is found, then in one embodiment, the grid location and angle of the simulated tool are recorded along with the node or section finding 1212, and processing again determines whether the last grid point has been processed 1214.

Processing determines whether a vulnerability was identified 1216, and if so, the security circuit is fixed in the identified area 1218 by, for instance, returning to the process of FIG. 10. Otherwise, processing is complete 1220. As noted, a security circuit pattern with no vulnerabilities using this process ensures that the security circuit will detect any attempted intrusion with a similar size tool, and trigger clearing of the secured information or data.

Note with respect to the description provided herein that cognitive rule adjustments can be made in the processing at one or more stages. As noted, machine learning can be used to make adjustments in a rules database, such as noted in the system diagram for the random security circuit system used when creating or establishing random trace patterns. The system can be trained using analysis of completed patterns that meet security requirements, and the conditions under which a trace had to be reestablished or redrawn (e.g., due to intersection with another trace segment). In one or more embodiments, the rules can thus be dynamically adjusted over time, including, for instance: a maximum tolerance on distance range and/or angle of the random point selected from the last portion of the trace dependent upon how far into the pattern creation the process is (e.g., the process could use longer sections of trace in the beginning, and then slowly employ shorter sections to prevent intersections as more trace sections or segments are added); the threshold n that is used for the comparison between completed patterns; the number of consecutive times that a trace moves in the positive or negative direction in any one axis; an optimal distance that each section of trace can be from another section of trace to meet security requirements (e.g., machine learning may identify that 4 mils is sufficient); a maximum number of traces drawn before performing a security check; a maximum number of traces established before the pattern should be assumed to be too dense in certain areas; a section of trace should avoid an area of a sub-volume if a threshold count of trace segments has already been drawn there; the process can divide a sub-volume into smaller sub-shapes or areas sooner or before establishing any trace segments at all; and the ratio of conductive trace to non-conductive areas (e.g., copper to non-copper areas) across the pattern, or within a sub-volume. Those skilled in the art will understand that one or more other aspects of establishing the security circuit can also take advantage of machine learning, as described herein.

Figure 14:
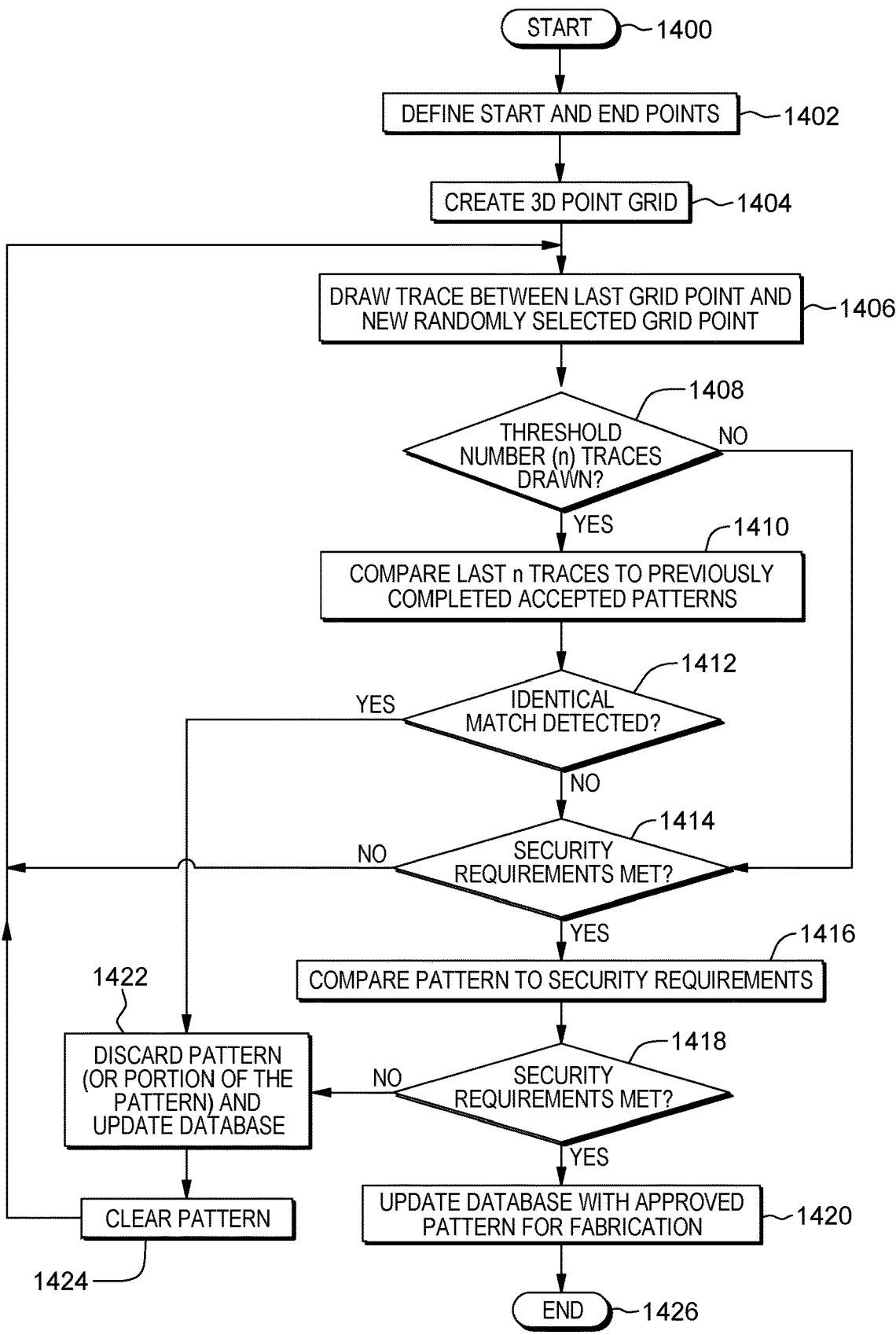
FIG. 14 depicts another embodiment of a workflow illustrating certain aspects of one or more embodiments of the present invention.

FIG. 14 depicts one embodiment of an alternate process for establishing a security circuit pattern, in accordance with one or more aspects disclosed herein. For instance, the process of FIG. 14 can, in one or more embodiments, be used in place of the process of FIG. 10. As noted, those skilled in the art will understand that (in one or more embodiments) program code executes on one or more computer resources and implements the processing disclosed. Generally, the process of FIG. 14 creates a three-dimensional point grid over the full volume of the geometry, that is, over the full sensor volume (or a sub-section or sub-volume of the full sensor volume), and connects trace segments between grid points rather than using the process of FIG. 10, which selects random points in three-dimensional space for the next trace segment (that is, selects points without following any defined grid).

Referring to FIG. 14, processing starts 1400 with defining start connection points and end connection points for the detection circuit 1402. Optionally, multiple detection or security circuits, each with their own start and end points can be defined. The start and end points can be chosen based on the geometry of the volume at issue, and the product in which the sensor is to reside.

Figure 15:
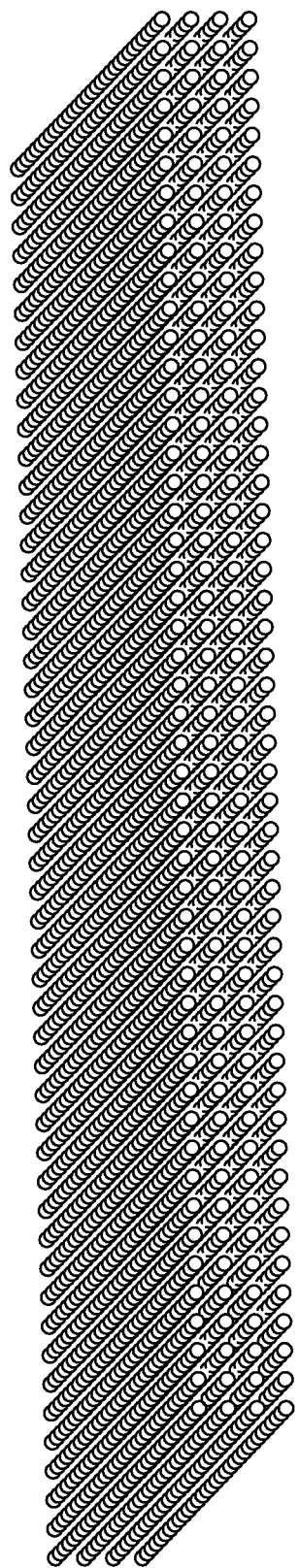
FIG. 15 illustrates a 3-D point grid within a sensor volume for use in generating one or more trace configurations for a security circuit pattern using, for instance, the workflow of FIG. 14.

A point grid is defined 1404, which in one embodiment, is a three-dimensional point grid that covers the entire sensor volume, such as in one or more layers of the sensor. One embodiment of this is depicted in FIG. 15, where an array of points is defined, as one example. In one or more embodiments, the point grid can be defined in a manner that assumes security requirements (e.g., FIPS 140-2 Level-4) are met if neighboring points are attached by a line. Note that the point grid can be predefined for a specific application, and remain constant for all randomly-generated patterns. Further, the point grid can optionally use "floating points" (e.g., a 1 mil sphere can be defined, where a point can be located anywhere within the sphere), such that more variability is added to the final patterns. Further, point grids can change through cognitive learning if acceptable patterns become difficult to generate, or if traces are becoming too long, to the point where changes in resistance due to tampering can be difficult to detect.

Processing begins or continues with an iterative process of establishing (e.g., drawing or simulating) a trace from the last grid point to a new randomly-selected grid point 1406. In one embodiment, the starting point can be where the iterative process begins. The method then determines whether a threshold number of traces (n) have been established (i.e., whether the loop has completed at least n iterations) 1408. The threshold n can be a preselected number of traces that the user wishes to have without repetition on multiple accepted patterns (e.g., the user can set n=20, such that no accepted pattern has a series of 20 identical traces). If at least n traces have been established, processing then compares the last n traces to previously completed, accepted conductive trace patterns 1410. The accepted trace patterns are patterns that have gone through the process and have been determined to meet all requirements, including the prespecified security requirements. Assuming that an identical match of the n trace segments between the current pattern and previously accepted patterns is not identified, then processing determines if the last trace segment reached the end point initially defined 1412. Assuming that the end point is not reached 1414, then the process loops back to draw another trace segment between the last grid point and a new randomly-selected grid point.

Assuming that the process does reach the end point initially defined, then the process proceeds to compare the pattern to the prespecified security requirements 1416. One approach to checking a pattern against the security requirements can be as described above in connection with FIG. 12.

If the randomly-generated pattern does not meet security requirements 1418, or if an identical match of n trace portions is detected at any point during the establishing of the security circuit pattern 1412, then the process discards the pattern (or a portion of the pattern), and updates the database with the failure criteria 1422. Note that the failure criteria can be utilized for cognitive learning, as described above. The process then clears the pattern 1424 before returning to begin establishing a new trace segment at the given grid location 1406. Note further that the given grid location will either be the start point defined at 1402, or the last-drawn trace minus the cleared n trace segments. If the established security circuit pattern meets the security requirements 1418, then processing updates the database with the approved circuit pattern 1420, before ending the process 1426. Note also that although described herein as generating the circuit pattern for 3-D printing, the approved pattern can be fabricated or constructed using a variety of approaches, and is not limited to 3-D printing only.

Those skilled in the art will note from the above description that provided herein, in one or more embodiments, is a method for generating a random security circuit pattern for fabrication within a tamper-respondent sensor of a tamper-respondent assembly. In one embodiment, the method includes defining a number of circuit traces, where each circuit trace includes a defined start point and end point, and responsive to establishing a boundary area, sub-dividing the sensor volume for the boundary area into one or more sub-volumes. Trace criteria are defined or specified for the circuit traces, and the circuit traces are generated into each sub-volume. Once approved, a database with the full volume pattern is updated based on the generated circuit traces for each sub-volume, and a fabrication system, such as a 3-D printing apparatus, is instructed to produce the circuit traces for each sub-volume, and thereby produce a security circuit with a random pattern for the tamper-respondent sensor.

Further exemplary embodiments of a computing environment to implement one or more aspects of the present invention are described below with reference to FIGS. 16-18.

By way of further example, FIG. 16 depicts one embodiment of a computing environment 1600, which includes a computing system 1612. Examples of well-known computing systems, environments, and/or configurations that may be suitable for use with computer system 1612 include, but are not limited to, a server, a desktop computer, a work station, a wireless computer, a handheld or laptop computer or device, a mobile phone, a programmable consumer electronic device, a tablet, a personal digital assistant (PDA), and the like.

Computing system 1612 can be described in the general context of computer system-executable instructions, such as program modules, being executed by a computer system. Generally, program modules include routines, programs, objects, components, logic, data structures, and so on that perform particular tasks or implement particular abstract data types.

As depicted in FIG. 16, computing system 1612, is shown in the form of a general-purpose computing device. The components of computing system 1612 can include, but are not limited to, one or more processors or processing units 1616, a system memory 1623, and a bus 1618 that couples various system components including system memory 1623 to processor 1616.

In one embodiment, processor 1616 can be based on the z/Architecture© offered by International Business Machines Corporation, or other architectures offered by International Business Machines Corporation or other companies.

Bus 1618 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computing system 1612 can include a variety of computer system readable media. Such media may be any available media that is accessible by computing system 1612, and it includes both volatile and non-volatile media, removable and non-removable media.

System memory 1623 can include computer system readable media in the form of volatile memory, such as random access memory (RAM) 1630 and/or cache memory 1632. Computing system 1612 can further include other removable/non-removable, volatile/non-volatile computer system storage media. By way of example only, storage system 1634 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media could be provided. In such instances, each can be connected to bus 1618 by one or more data media interfaces. As described below, memory 1623 can include at least one program product having a set (e.g., at least one) of program modules or code that are configured to carry out the functions of embodiments of the invention.

Program/utility 1640, having a set (at least one) of program modules 1642, can be stored in memory 1632 by way of example, and not limitation, as well as an operating system, one or more application programs, other program modules, and program data. Each of the operating system, one or more application programs, other program modules, and program data or some combination thereof, can include an implementation of a networking environment. Program modules 1642 generally carry out the functions and/or methodologies of embodiments of the invention as described herein. Alternatively, a tamper-respondent sensor design and fabrication processing facility, module, logic, etc., 1601 can be provided within computing environment 1612, as disclosed herein.

Computing system 1612 can also communicate with one or more external devices 1614 such as a keyboard, a pointing device, a display 1624, etc.; one or more devices that enable a user to interact with computing system 1612; and/or any devices (e.g., network card, modem, etc.) that enable computing system 1612 to communicate with one or more other computing devices. Such communication can occur via Input/Output (I/O) interfaces 1622. Still yet, computing system 1612 can communicate with one or more networks such as a local area network (LAN), a general wide area network (WAN), and/or a public network (e.g., the Internet) via network adapter 1620. As depicted, network adapter 1620 communicates with the other components of computing system, 1612, via bus 1618. It should be understood that although not shown, other hardware and/or software components could be used in conjunction with computing system 1612. Examples, include, but are not limited to: microcode, device drivers, redundant processing units, external disk drive arrays, RAID systems, tape drives, and data archival storage systems, etc.

One or more aspects may relate to or use cloud computing.

It is understood in advance that although this disclosure includes a detailed description on cloud computing, implementation of certain teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as Follows:

Software as a Service (SaaS): the capability provided to the consumer is to use the provider's applications running on a cloud infrastructure. The applications are accessible from various client devices through a thin client interface such as a web browser (e.g., web-based email). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

A cloud computing node can include a computer system/server, such as the one depicted in FIG. 16. Computer system/server 1612 of FIG. 16 can be practiced in distributed cloud computing environments where tasks are performed by remote processing devices that are linked through a communications network. In a distributed cloud computing environment, program modules may be located in both local and remote computer system storage media including memory storage devices. Computer system/server 1612 is capable of being implemented and/or performing any of the functionality set forth hereinabove.

Figure 17:
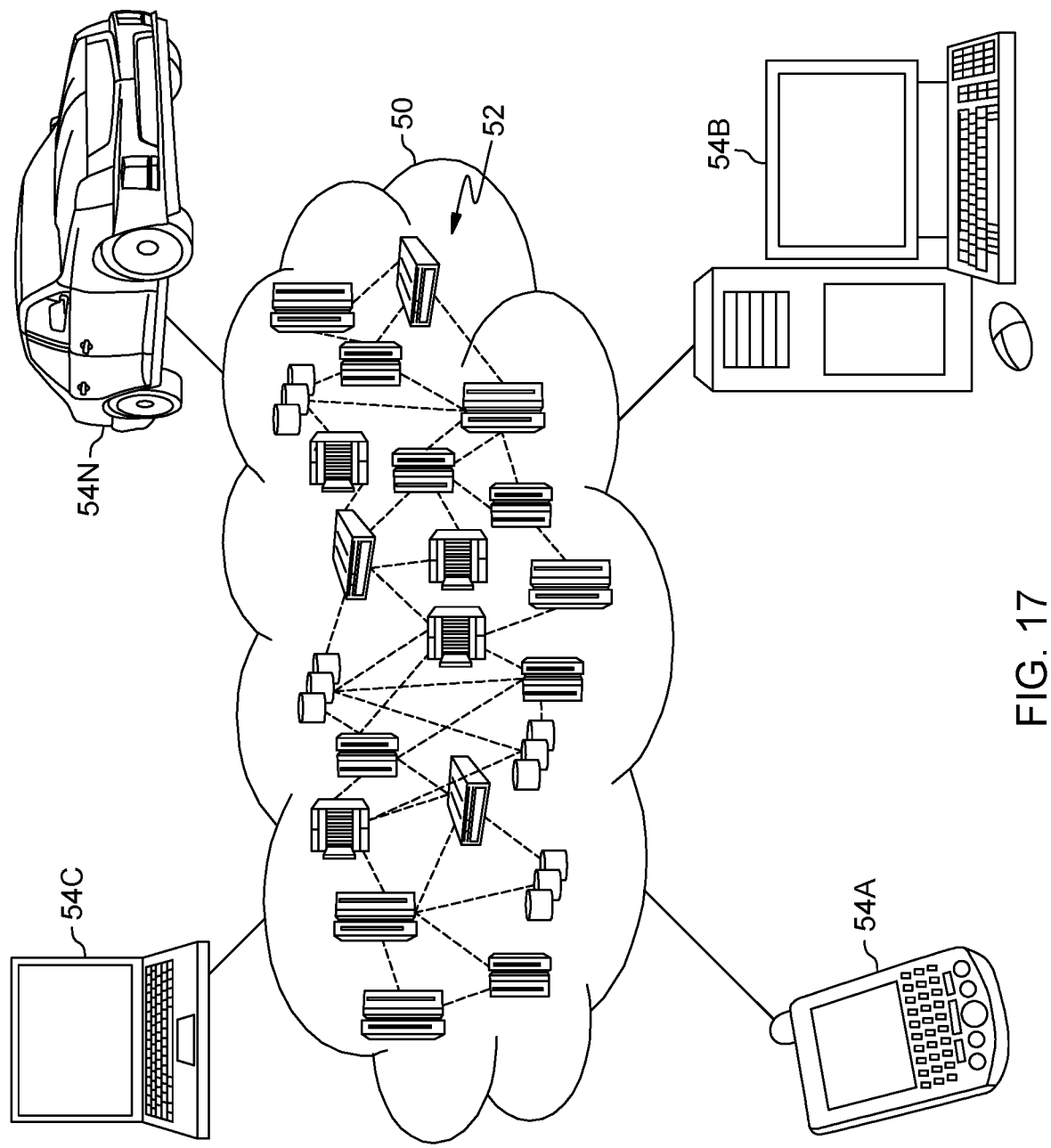
FIG. 17 depicts an embodiment of a cloud computing environment which can facilitate implementing, or be used in association with, certain aspects of an embodiment of the present invention.

Referring now to FIG. 17, illustrative cloud computing environment 50 is depicted. As shown, cloud computing environment 50 can comprise one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 6 are intended to be illustrative only and that computing nodes 10 and cloud computing environment 50 can communicate with any type of computerized device over any type of network and/or network addressable connection (e.g., using a web browser).

Figure 18:
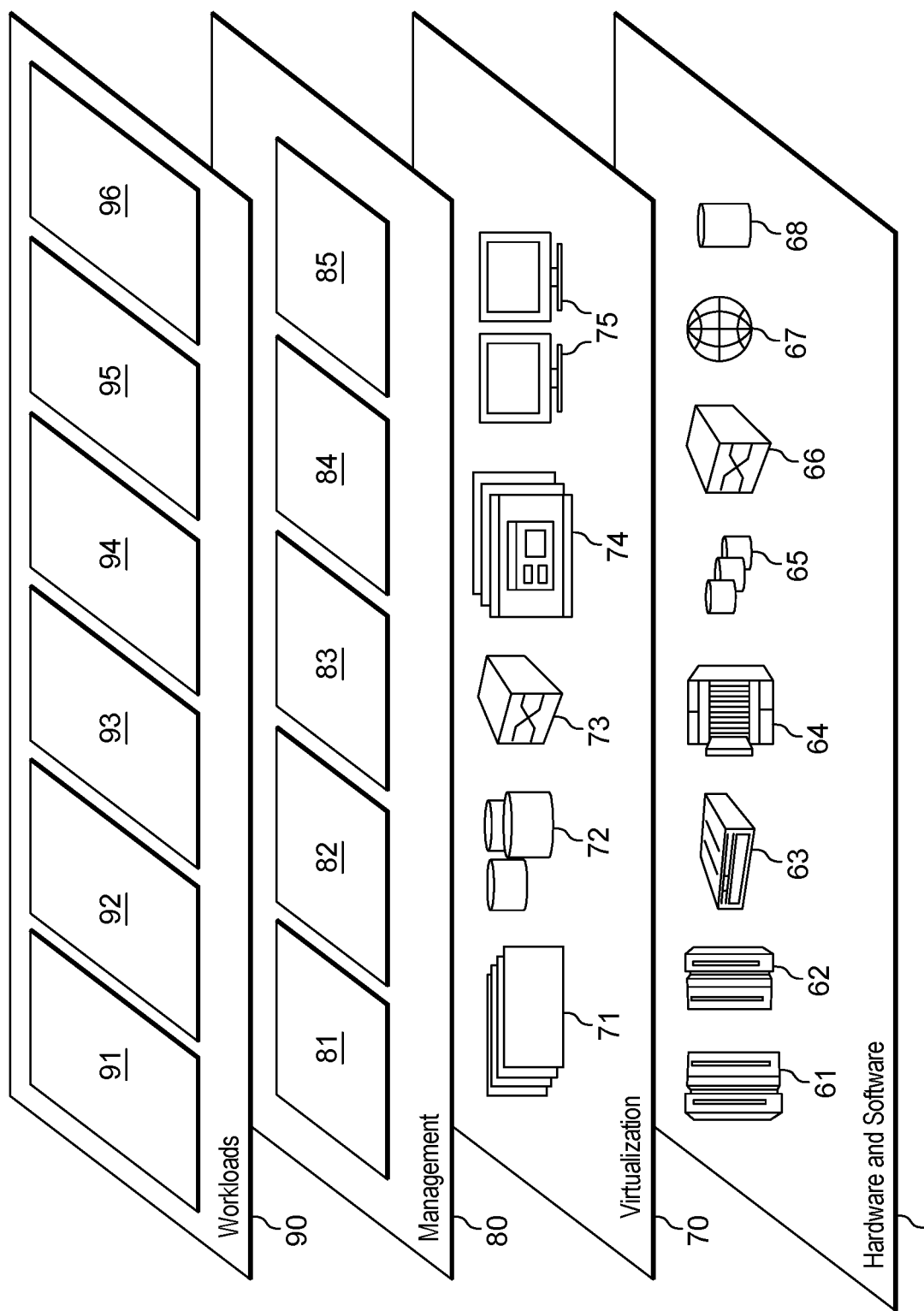
FIG. 18 depicts abstraction model layers according to an embodiment of the present invention.

Referring to FIG. 18, a set of functional abstraction layers provided by cloud computing environment 50 (FIG. 17) is shown. It should be understood in advance that the components, layers, and functions shown in FIG. 18 are intended to be illustrative only and embodiments of the invention are not limited thereto. As depicted, the following layers and corresponding functions are provided:

Hardware and software layer 60 includes hardware and software components. Examples of hardware components include mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and tamper-respondent sensor design and fabrication processing 96.

The descriptions of the various embodiments of the present invention have been presented for purposes of illustration, but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein.

The present invention may be a system, a method, and/or a computer program product at any possible technical detail level of integration. The computer program product can include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer-implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In addition to the above, one or more aspects may be provided, offered, deployed, managed, serviced, etc. by a service provider who offers management of customer environments. For instance, the service provider can create, maintain, support, etc. computer code and/or a computer infrastructure that performs one or more aspects for one or more customers. In return, the service provider may receive payment from the customer under a subscription and/or fee agreement, as examples. Additionally or alternatively, the service provider may receive payment from the sale of advertising content to one or more third parties.

In one aspect, an application may be deployed for performing one or more embodiments. As one example, the deploying of an application comprises providing computer infrastructure operable to perform one or more embodiments.

As a further aspect, a computing infrastructure may be deployed comprising integrating computer readable code into a computing system, in which the code in combination with the computing system is capable of performing one or more embodiments.

As yet a further aspect, a process for integrating computing infrastructure comprising integrating computer readable code into a computer system may be provided. The computer system comprises a computer readable medium, in which the computer medium comprises one or more embodiments. The code in combination with the computer system is capable of performing one or more embodiments.

Although various embodiments are described above, these are only examples. For example, computing environments of other architectures can be used to incorporate and use one or more embodiments. Further, different instructions, instruction formats, instruction fields and/or instruction values may be used. Many variations are possible.

Further, other types of computing environments can benefit and be used. As an example, a data processing system suitable for storing and/or executing program code is usable that includes at least two processors coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method of fabricating a tamper-respondent sensor, the method comprising:
    establishing a security circuit pattern for a security circuit of a tamper-respondent sensor to enclose one or more components of a circuit board within a secure volume, the establishing including:
        determining in three dimensions boundaries for the security circuit of the tamper-respondent sensor, the boundaries defining a sensor volume which the security circuit is to fill in three dimensions;
        generating at least one trace configuration for the security circuit pattern, the at least one trace configuration defining a random, three-dimensional security pattern to fill the sensor volume, and the at least one trace configuration establishing, at least in part, the security circuit pattern; and
    fabricating the tamper-respondent sensor based on the established security circuit pattern.

2. The method of claim 1, wherein the establishing further comprises:
    defining a point grid throughout the sensor volume with an array of grid points; and
    wherein the generating comprises generating the at least one trace configuration for the security circuit pattern between randomly-selected grid points of the point grid defined throughout the sensor volume.

3. The method of claim 1, wherein the fabricating comprises 3-D printing the tamper-respondent sensor using, at least in part, the established security circuit pattern.

4. A method comprising:
    establishing a security circuit pattern for a security circuit of a tamper-respondent sensor to enclose, at least in part, one or more components of a circuit board within a secure volume, the establishing including:
        determining in three dimensions boundaries for the security circuit of the tamper-respondent sensor, the boundaries defining a sensor volume within which the security circuit is to reside;
        generating at least one trace configuration for the security circuit pattern, the at least one trace configuration defining a random, three-dimensional security pattern within the sensor volume, and the at least one trace configuration establishing, at least in part, the security circuit pattern;
    wherein the establishing further includes dividing the sensor volume into multiple sub-volumes, and the generating includes generating multiple trace configurations for the multiple sub-volumes, a trace configuration of the multiple trace configurations to reside within an associated sub-volume of the multiple sub-volumes, the trace configuration defining a respective random, three-dimensional security pattern within the associated sub-volume; and
    fabricating the tamper-respondent sensor using, at least in part, the established security circuit pattern.

5. The method of claim 4, wherein each trace configuration of the multiple trace configurations is a unique trace configuration.

6. The method of claim 4, wherein each trace configuration of the multiple trace configurations has a respective defined start connection point and end connection point at one or more boundaries of the sensor volume.

7. The method of claim 6, further comprising:
    for each trace configuration of the multiple trace configurations, selecting a random start point and a random end point within the associated sub-volume; and
    providing a respective trace segment into the associated sub-volume from the defined start connection point to the selected random start point, and another trace segment into the associated sub-volume from the defined end connection point to the selected random end point, wherein the trace segment and the other trace segment are segments of the respective random, three-dimensional security pattern within the associated sub-volume.

8. The method of claim 4, wherein the generating further comprises comparing each generated trace configuration of the multiple trace configurations to previously accepted trace configurations to confirm that each trace configuration of the multiple trace configurations is unique.

9. The method of claim 4, wherein generating the multiple trace configurations for the multiple sub-volumes further comprises:
    determining, for a trace configuration of the multiple trace configurations, whether the trace configuration meets predefined security requirements for the tamper-respondent sensor;
    based on the predefined security requirements not being met, identifying in the associated sub-volume one or more sub-spaces of the sub-volume to include one or more further trace segments of the configuration trace; and
    generating the further trace segment(s) within the sub-space(s) to facilitate the respective random, three-dimensional security pattern within the associated sub-volume meeting the prespecified security requirements.

10. The method of claim 9, further comprising determining that each trace configuration of the multiple trace configurations meets prespecified security requirements for the tamper-respondent sensor, the determining including:
    creating a tamper drill simulation with a tamper drill size equal to a smallest tamper size specified for security compliance;
    creating an xyz point grid over the sensor volume with an array of points; and for each point of the array of points in the xyz point grid, iterate through multiple drill insertion angles to check for intersection of the tamper drill with at least one trace portion of the random, three-dimensional security pattern.

11. A method of fabricating a tamper-respondent sensor, the method comprising:
producing a plurality of tamper-respondent sensors for a plurality of tamper-respondent assemblies, the producing comprising for each tamper-respondent sensor:
establishing a security circuit pattern for a security circuit of the tamper-respondent sensor to enclose one or more components of a respective circuit board within a secure volume, the establishing including:
determining in three dimensions boundaries for the security circuit of the tamper-respondent sensor, the boundaries defining a sensor volume which the security circuit is to fill in three dimensions;
generating at least one trace configuration for the security circuit pattern, the at least one trace configuration defining a random, three-dimensional security pattern to fill the sensor volume, and the at least one trace configuration establishing, at least in part, the security circuit pattern;
confirming that the security circuit pattern is distinct from any other security circuit pattern of the plurality of tamper-respondent sensors; and
fabricating the tamper-respondent sensor based on the established security circuit pattern.

12. The method of claim 11, wherein the establishing further includes:
dividing the sensor volume into multiple sub-volumes; and
wherein the generating comprises generating multiple trace configurations for the multiple sub-volumes, a trace configuration of the multiple trace configurations to reside within an associated sub-volume of the multiple sub-volumes, the trace configuration defining a respective random, three-dimensional security pattern within the associated sub-volume.

13. The method of claim 12, wherein each trace configuration of the multiple trace configurations has a respective defined start connection point and defined end connection point at one or more boundaries of the sensor volume, and wherein the method further comprises:
for each trace configuration of the multiple trace configurations, selecting a random start point and a random end point within the associated sub-volume; and
providing a respective trace segment into the associated sub-volume from the defined start connection point to the selected random start point, and another trace segment into the associated sub-volume from the defined end connection point to the selected random end point, wherein the trace segment and the other trace segment are segments of the respective random, three-dimensional security pattern within the associated sub-volume.

14. The method of claim 12, wherein generating the multiple trace configurations for the multiple sub-volumes further comprises:
determining, for a trace configuration of the multiple trace configurations, whether the trace configuration meets predefined security requirements for the tamper-respondent sensor;
based on the predefined security requirements not being met, identifying in the associated sub-volume one or more sub-spaces of the sub-volume to include one or more further trace segments of the configuration trace; and
generating the one or more further trace segments within the one or more sub-spaces to facilitate the respective random, three-dimensional security pattern within the associated sub-volume meeting the prespecified security requirements.

15. The method of claim 11, wherein the establishing further comprises:
defining a point grid throughout the sensor volume with an array of grid points; and
wherein the generating comprises generating the at least one trace configuration for the security circuit pattern between randomly-selected grid points of the point grid defined throughout the sensor volume.

16. The method of claim 11, wherein the fabricating comprises 3-D printing the tamper-respondent sensor using, at least in part, the established security circuit pattern.

* * * * *